(12) United States Patent  
Park et al.

(10) Patent No.: US 9,312,453 B2
(45) Date of Patent: Apr. 12, 2016

(54) SEMICONDUCTOR LIGHT EMITTING DEVICE

(71) Applicant: SEMICON LIGHT CO., LTD., Gyeonngi-do (KR)

(72) Inventors: Eun Hyun Park, Gyeonggi-do (KR); Soo Kun Jeon, Gyeonngi-do (KR)

(73) Assignee: SEMICON LIGHT CO., LTD., Gyeonngi-Do (KR)

( * ) Notice: Subject to any disclaimer, the term of this patent is extended or adjusted under 35 U.S.C. 154(b) by 0 days.

(21) Appl. No.: 14/383,420

(22) PCT Filed: Apr. 30, 2014

(86) PCT No.: PCT/KR2014/003862
§ 371 (c)(1),
(2) Date: Sep. 5, 2014

(87) PCT Pub. No.: WO2014/178651
PCT Pub. Date: Nov. 6, 2014

(65) Prior Publication Data
US 2015/0236215 A1 Aug. 20, 2015

(30) Foreign Application Priority Data

Apr. 30, 2013 (KR) .................. 10-2013-0048123
May 15, 2013 (KR) .................. 10-2013-0055190

(51) Int. Cl.
*H01L 33/00* (2010.01)
*H01L 33/46* (2010.01)
*H01L 33/38* (2010.01)

(52) U.S. Cl.
CPC .............. *H01L 33/46* (2013.01); *H01L 33/387* (2013.01)

(58) Field of Classification Search
CPC ............ H01L 51/0067; H01L 51/0072; H01L 51/5044; H01L 51/506; H01L 51/5265; H01L 51/5268; H01L 51/5278; H01L 51/5068; H01L 51/5064; H01L 51/0085; H01L 51/0071; H01L 51/5218; H01L 51/0061; H01L 51/0052; H01L 51/5092
USPC ......... 257/12–13, 40, 81, 84, 87–89, 98–100, 257/347–348, 433–434; 313/112, 501, 503, 313/506–507
See application file for complete search history.

(56) References Cited

U.S. PATENT DOCUMENTS 7,262,436 B2  8/2007  Kondoh et al. ................. 257/94
8,373,188 B2 * 2/2013  Suh et al. ........................ 257/98

(Continued)

FOREIGN PATENT DOCUMENTS

JP  2006-120913  5/2006  ............. H01L 33/00
JP  2009-164423  7/2009  ............. H01L 33/00

(Continued)

*Primary Examiner* — Dung Le
(74) *Attorney, Agent, or Firm* — Harness, Dickey & Pierce, P.L.C.

(57) ABSTRACT

The present disclosure relates to a semiconductor light emitting device, which comprises a plurality of semiconductor layers; a contact area where a first semiconductor layer is exposed as a result of the partial removal of a second semiconductor layer and an active layer; a non-conductive reflective film adapted to cover the second semiconductor layer and the contact area, such that light from the active layer is reflected towards the first semiconductor layer on the side of a growth substrate; a finger electrode extending between the non-conductive reflective film and the plurality of semiconductor layers; an electrical connection adapted to pass through the non-conductive reflective film and be electrically connected with the finger electrode; and a direct-connection type electrical connection adapted to pass through the non-conductive reflective film and be electrically connected with the plurality of semiconductor layers.

14 Claims, 10 Drawing Sheets

(56) References Cited

U.S. PATENT DOCUMENTS

| | | | |
|---|---|---|---|
| 8,552,447 B2 * | 10/2013 | Yahata et al. | 257/98 |
| 8,969,895 B2 * | 3/2015 | Kim et al. | 257/98 |
| 2014/0217439 A1 | 8/2014 | Jeon et al. | 257/98 |

FOREIGN PATENT DOCUMENTS

| | | | |
|---|---|---|---|
| KR | 10-2012-0052746 | 5/2012 | H01L 33/36 |
| KR | 10-1182189 | 9/2012 | H01L 33/36 |
| KR | 10-1226706 | 1/2013 | H01L 33/36 |

* cited by examiner

Prior Art

US 9,312,453 B2

SEMICONDUCTOR LIGHT EMITTING DEVICE

CROSS-REFERENCE TO RELATED APPLICATIONS

This application is a national phase application of PCT Application No. PCT/KR2014/003862, filed on 30 Apr. 2014, which claims the benefit and priority to Korean Patent Application No. 10-2013-0048123, filed 30 Apr. 2013 and to Korean Patent Application No. 10-2013-0055190, filed 15 May 2013. The entire disclosures of the applications identified in this paragraph are incorporated herein by references.

TECHNICAL FIELD

The present disclosure relates generally to a semiconductor light emitting device, and more particularly to a semiconductor light emitting device having an improved light extraction efficiency.

Within the context herein, the term "semiconductor light emitting device" refers to a semiconductor optical device which generates light via electron-hole recombination, and one example is a group III-nitride semiconductor light emitting device. The group III-nitride semiconductor consists of a compound containing $Al_{(x)}Ga_{(y)}In_{(1-x-y)}N$ (wherein, $0 \le x \le 1$, $0 \le y \le 1$, $0 \le x+y \le 1$). Another example thereof is a GaAs-based semiconductor light emitting device used for red light emission.

BACKGROUND

This section provides background information related to the present disclosure which is not necessarily prior art.

FIG. 1 is a view illustrating an example of the semiconductor light emitting device proposed in U.S. Pat. No. 7,262,436. The semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, while serving as reflective films, and an n-side bonding pad 800 formed on the n-type semiconductor layer 300 which has been etched and exposed. The n-type semiconductor layer 300 and the p-type semiconductor layer 500 can be of opposite conductive types. Preferably, a buffer layer (not shown) is provided between the substrate 100 and the n-type semiconductor layer 300. A chip having this structure, i.e. where all the electrodes 901, 902 and 903 and the n-side bonding pad 800 are formed on the opposite side of the substrate 100, with the electrodes 901, 902 and 903 serving as reflective films, is called a flip-chip. The electrodes 901, 902 and 903 are made up of an electrode 901 (e.g., Ag) with a high reflectance, an electrode 903 (e.g., Au) for bonding, and an electrode 902 (e.g., Ni) for preventing diffusion between materials of the electrode 901 and materials of the electrode 903. While this metal reflective film structure has a high reflectance and is advantageous for current spreading, it has a drawback that the metal absorbs light.

FIG. 2 is a view illustrating an example of the semiconductor light emitting device proposed in JP Pub. No. 2006-120913. The semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light-transmitting conductive film 600 with a current spreading function formed on the p-type semiconductor layer 500, a p-side bonding pad 700 formed on the light-transmitting conductive film 600, and an n-side bonding pad 800 formed on the n-type semiconductor layer 300 which has been etched and exposed. Further, a DBR (Distributed Bragg Reflector) 900 and a metal reflective film 904 are provided on the light-transmitting conductive film 600. While this structure reduces light absorption by the metal reflective film 904, it has a drawback that current spreading is relatively poor, compared with the use of the electrodes 901, 902 and 903.

FIG. 3 is a view illustrating an example of the semiconductor light emitting device proposed in JP Pub. No. 2009-164423. In the semiconductor light emitting device, a DBR 900 and a metal reflective film 904 are provided on a plurality of semiconductor layers 300, 400 and 500, a phosphor 1000 is provided on opposite side thereof. The metal reflective film 904 and an n-side bonding pad 800 are electrically connected with external electrodes 1100 and 1200. The external electrodes 1100 and 1200 can be lead frames for a package, or electrical patterns provided on the COB (Chip on Board) or PCB (Printed Circuit Board). The phosphor 1000 can be coated conformally, or can be mixed with an epoxy resin and then used to cover the external electrodes 1100 and 1200. The phosphor 1000 absorbs light that is generated in the active layer, and converts this light to a light of longer or shorter wavelength.

FIG. 10 is a view illustrating another example of the semiconductor light emitting device in the prior art, in which semiconductor light emitting device includes a substrate 10 (e.g., a sapphire substrate), a buffer layer 20 grown on the substrate 10, an n-type semiconductor layer 30 grown on the buffer layer 20, an active layer 40 grown on the n-type semiconductor layer 30, a p-type semiconductor layer 50 grown on the active layer 40, a current-spreading conductive film 60 formed on the p-type semiconductor layer 50, a p-side electrode 70 formed on the current-spreading conductive film 60, an n-side electrode 80 formed on an exposed portion of the n-type semiconductor layer 30 resulted from the mesa etching of the p-type semiconductor layer 50 and the active layer 40, and a protective film 90. The current-spreading conductive film 60 is provided to promote the current supply over the entire p-type semiconductor layer 50. The current-spreading conductive film 60 is formed across almost the entire face of the p-type semiconductor layer 50, and can be configured, for example, as a light-transmitting conductive film made of ITO or Ni and Au, or as a reflective conductive film made of Ag. The p-side electrode 70 and the n-side electrode 80 are metal electrodes for supplying current, which can be made of any material from the group consisting of nickel, gold, silver, chromium, titanium, platinum, palladium, rhodium, iridium, aluminum, tin, indium, tantalum, copper, cobalt, iron, ruthenium, zirconium, tungsten and molybdenum, or any combination thereof, for example. The protective film 90 is made of a material such as $SiO_2$, and may be omitted. To meet the needs of semiconductors light emitting devices of larger areas and greater power consumption, finger electrodes and a plurality of electrodes have been adopted to facilitate the current spreading in the semiconductor light emitting device. For instance, a semiconductor light emitting device having a larger area (e.g., width/length=1000 um/1000 um) has finger electrodes for each of the p-side electrode 70 and the n-side electrode 80 in order to provide an enhanced current spreading effect, and also a plurality of p-side electrodes 70 as well as a plurality of n-side electrodes 80 such that a sufficient amount of current is supplied. However, since metallic electrodes such as the p-side electrodes 70 and the n-side electrodes 80 usually have a large thickness and there is a greater loss in the light absorption accordingly, their light extraction efficiency is deteriorated.

Technical Problem

The problems to be solved by the present disclosure will be described in the latter part of the best mode for carrying out the invention.

SUMMARY

This section provides a general summary of the present disclosure and is not a comprehensive disclosure of its full scope or all of its features.

According to one aspect of the present disclosure, there is provided a semiconductor light emitting device, comprising: a plurality of semiconductor layers; a contact area where a first semiconductor layer is exposed as a result of the partial removal of a second semiconductor layer and an active layer; a non-conductive reflective film adapted to cover the second semiconductor layer and the contact area, such that light from the active layer is reflected towards the first semiconductor layer on the side of a growth substrate; a finger electrode extending between the non-conductive reflective film and the plurality of semiconductor layers; an electrical connection adapted to pass through the non-conductive reflective film and be electrically connected with the finger electrode; and a direct-connection type electrical connection adapted to pass through the non-conductive reflective film and be electrically connected with the plurality of semiconductor layers.

According to another aspect of the present disclosure, there is provided a semiconductor light emitting device, comprising: a plurality of semiconductor layers, which grows sequentially using a growth substrate, and which includes a first semiconductor layer having a first conductivity, a second semiconductor layer having a second conductivity different from the first conductivity, and an active layer interposed between the first semiconductor layer and the second semiconductor layer, generating light via electron-hole recombination; a current-spreading conductive film arranged on the second semiconductor layer; a first electrode, which is arranged on the current-spreading conductive film; and a current blocking layer, which is arranged below the first electrode, being interposed between the second semiconductor layer and the current-spreading conductive film, and which has inclined faces on the edges.

According to another aspect of the present disclosure, there is provided a method for fabricating a semiconductor light emitting device, comprising: preparing a plurality of semiconductor layers, which grows sequentially using a growth substrate, and which includes a first semiconductor layer having a first conductivity, a second semiconductor layer having a second conductivity different from the first conductivity, and an active layer interposed between the first semiconductor layer and the second semiconductor layer, generating light via electron-hole recombination; forming a current blocking layer on the second semiconductor layer; forming a mask to cover a certain region of the current blocking layer, removing the current blocking layer that is not covered with the mask, and forming, by an etching operation, inclined faces at the edges of the current blocking layer remaining below the edge of the mask; forming a current-spreading conductive film in such a way as to cover the second semiconductor layer and the remaining current blocking layer; and forming electrodes on the current-spreading conductive film such that the electrodes are arranged on top of the remaining current blocking layer.

Advantageous Effects

The advantageous effects of the present disclosure will be described in the latter part of the best mode for carrying out the invention.

DRAWINGS

FIG. 1 is a view illustrating an example of the semiconductor light emitting device proposed in U.S. Pat. No. 7,262,436.

DETAILED DESCRIPTION

The present disclosure will now be described in detail with reference to the accompanying drawings.

Figure 1:
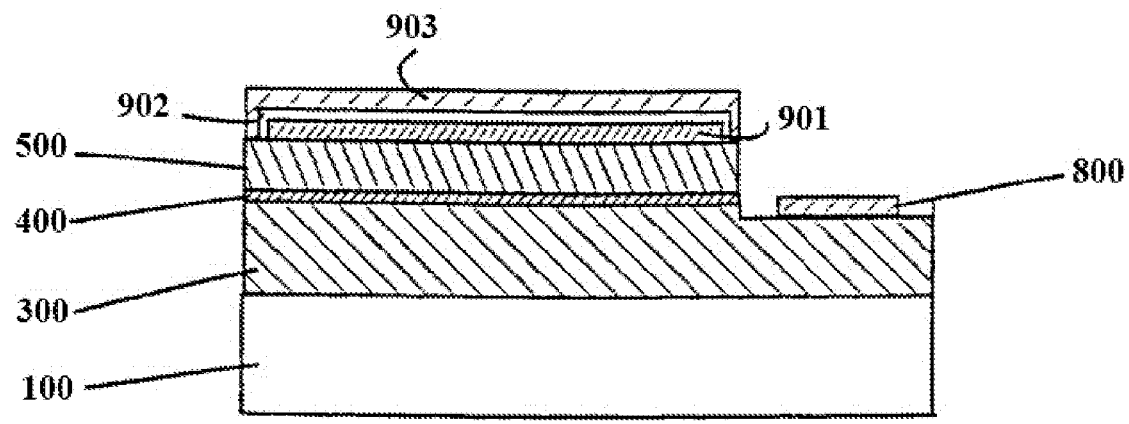
Figure 2:
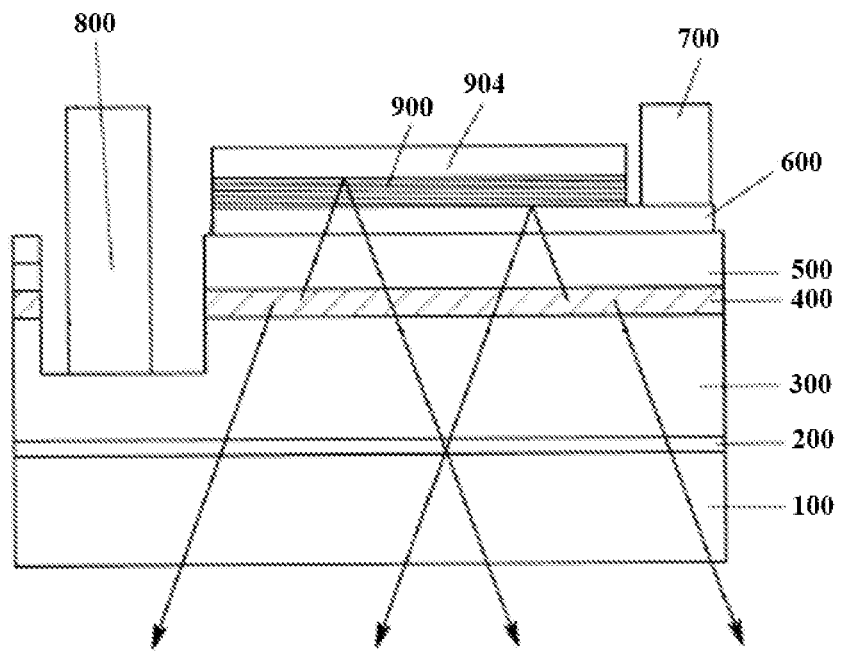
FIG. 2 is a view illustrating an example of the semiconductor light emitting device proposed in JP Pub. No. 2006-120913.
Figure 3:
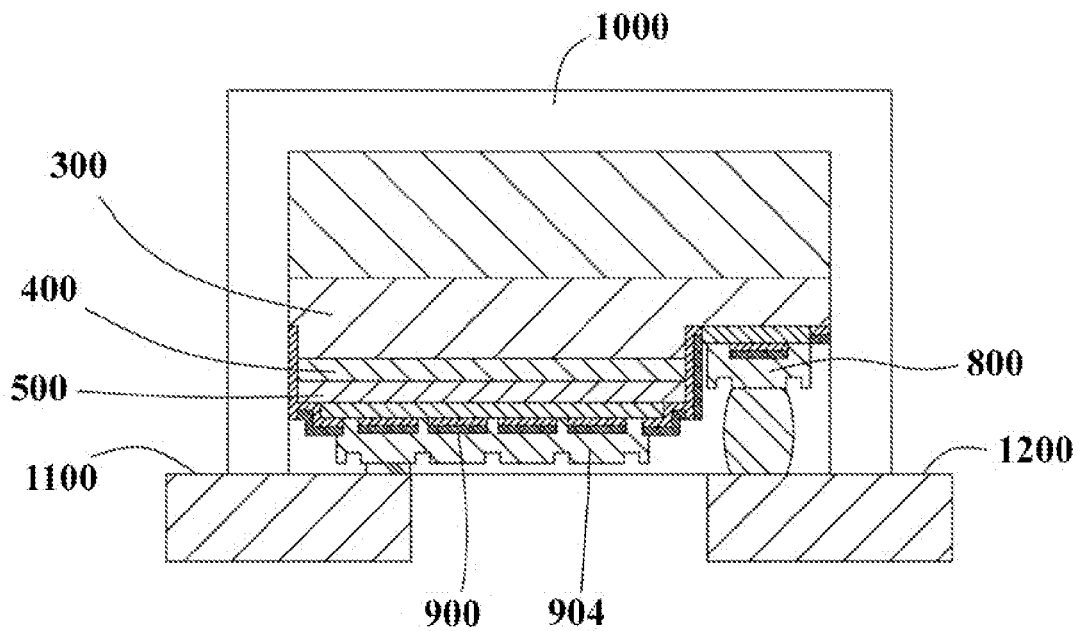
FIG. 3 is a view illustrating an example of the semiconductor light emitting device proposed in JP Pub. No. 2009-164423.
Figure 4:
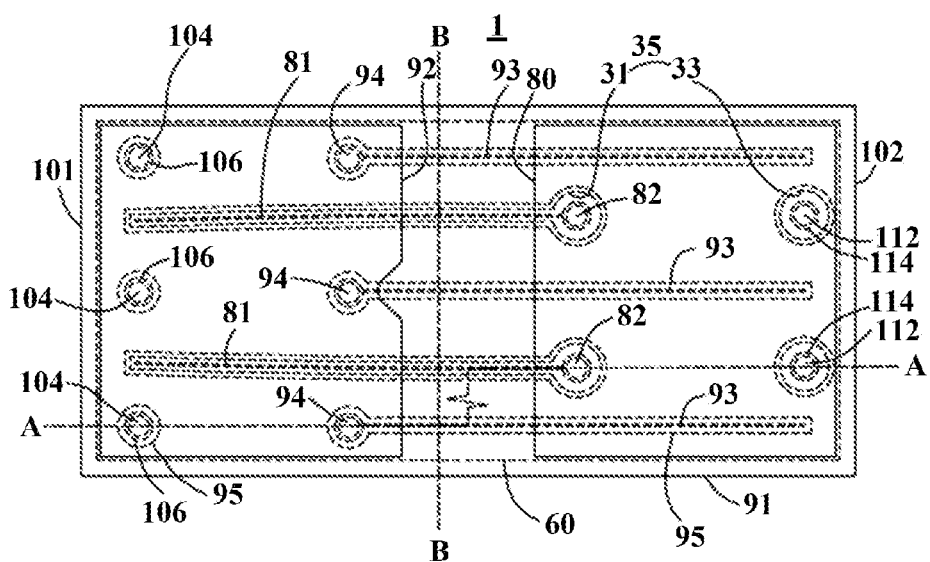
FIG. 4 is a view illustrating an example of the semiconductor light emitting device according to the present disclosure.
Figure 5:
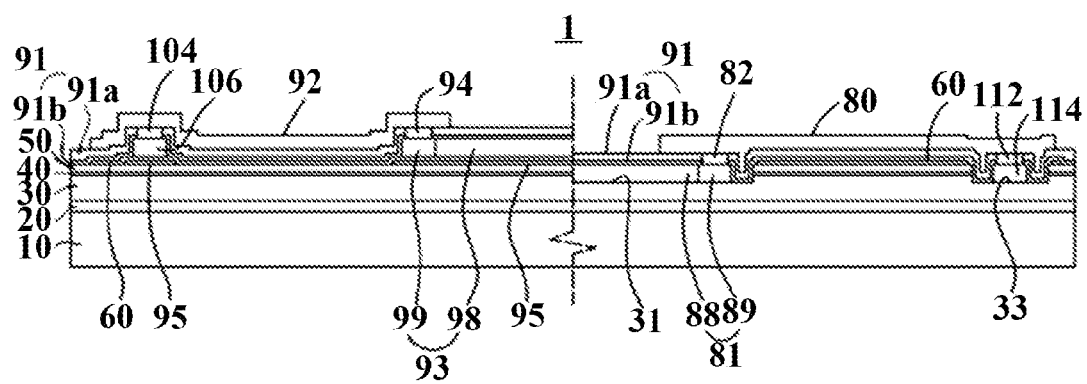
FIG. 5 is a cross section view taken along line A-A of FIG. 4.
Figure 6:
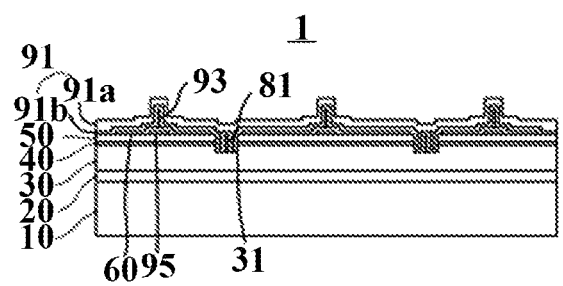
FIG. 6 is a cross section view taken along line B-B of FIG. 4.
Figure 7:
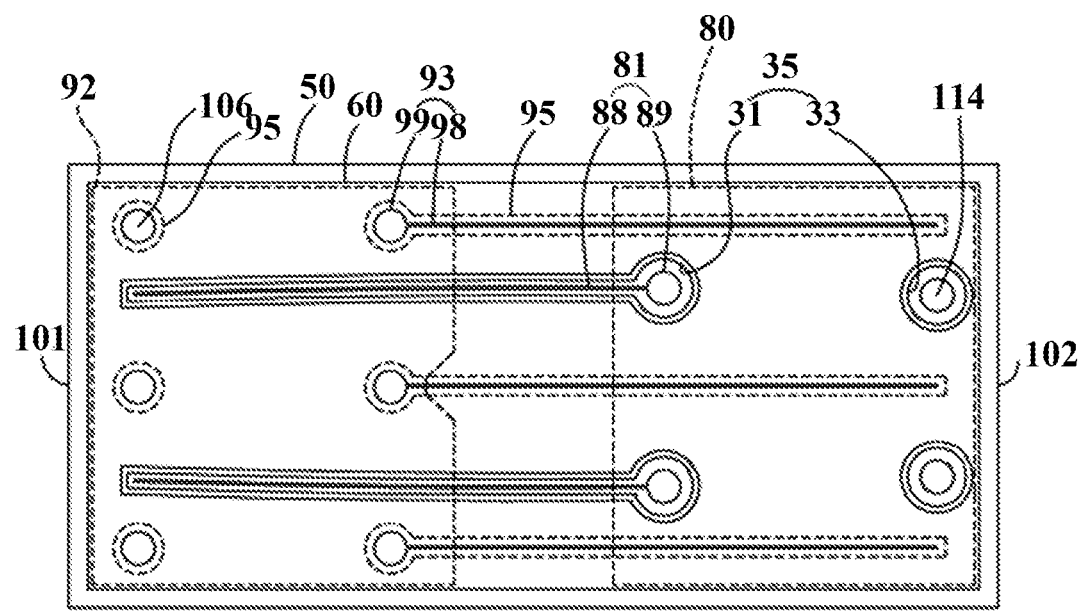
FIG. 7 is a view illustrating the semiconductor light emitting device of FIG. 4, without the p-side and n-side electrodes and the non-conductive reflective film.

FIG. 4 is a view illustrating an example of the semiconductor light emitting device according to the present disclosure, FIG. 5 is a cross section view taken along line A-A of FIG. 4, and FIG. 6 is a cross section view taken along line B-B of FIG. 4. FIG. 7 is a view illustrating the semiconductor light emitting device of FIG. 4, without the p-side and n-side electrodes and the non-conductive reflective film.

The semiconductor light emitting device 1 may have a roughly rectangular planar shape. For the sake of convenient explanation, in the following description, a short side on the left of the semiconductor light emitting device 1 as shown in FIG. 4 will be referred to as a first side 101, and the other short side on the right, opposite to the first side 101, will be referred to as a second side 102.

The semiconductor light emitting device 1 includes a substrate 10, a buffer layer 20 grown on the substrate 10, an n-type semiconductor layer 30 grown on the buffer layer 20, an active layer 40 grown on the n-type semiconductor layer 30, generating light via electron-hole recombination, and a p-type semiconductor layer 50 grown on the active layer 40.

Further, the semiconductor light emitting device 1 includes a contact area 35 where the n-type semiconductor layer 30 is exposed as a result of the partial removal of the p-type semiconductor layer 50 and the active layer 40; a non-conductive reflective film 91 adapted to cover the p-type semiconductor layer 50 and the contact area 35 so as to reflect light from the active layer 40 towards the n-type semiconductor layer 30 on the side of the growth substrate 10; a p-type electrode 92 which is formed on the first side 101 above the non-conductive reflective film 91 and supplies either electrons or holes to the p-type semiconductor layer 50; and an n-side electrode 80 which is formed on the second side 102 above the non-conductive reflective film 91, away from the p-side electrode 92, and supplies, to the n-type semiconductor layer 30, electrons if holes are supplied by the p-type electrode, or holes if the electrons are supplied by the p-type electrode.

The substrate 10, which can eventually be removed, is mainly made in use of sapphire, SiC, Si, GaN or the like, and the buffer layer 20 can be omitted. When the substrate 10 is removed or has conductivity, an n-side electrode 80 may be formed on the n-type semiconductor layer 30 side after the substrate 10 is removed therefrom, or on the conductive substrate 10 side. The positions of the n-type semiconductor layer 30 and the p-type semiconductor layer 50 can be changed with each other. For a group III nitride semiconductor light emitting device, those semiconductor layers are mainly made of GaN. Each of the semiconductor layers 20, 30, 40 and 50 can be configured in a plurality of sub layers. The semiconductor light emitting device may also have an additional semiconductor layer.

There are three p-side finger electrodes 93 between the p-type semiconductor layer 50 and the non-conductive reflective film 91. The p-side finger electrode 93 extends towards the n-side electrode 80, starting from a region of the p-side electrode 92 adjacent to the n-side electrode 80, and may reach the lower portion of the n-side electrode 80. That is, the p-side finger electrode 93 is stretched out from the first side 101 towards the second side 102 of the semiconductor light emitting device. With these long stretched, plural p-side finger electrodes 93, the device may be placed without leaning when it is overturned on a mount part (e.g., a PBC, a submount, a package or a COB (Chip on Board)). In this regard, it is preferable to have the finger electrodes 93 as long as possible within the marginal space in the construction of a device. In addition, the p-side finger electrode 93 can be divided into a finger part 98 that stretches out, and a connecting part 99 with a large width. The connecting part 99 is located at the end of the first side 101 of the p-side finger electrode 93 which is arranged below a region of the p-side electrode 92 adjacent to the n-side electrode 80. The number of the p-side finger electrodes 93 is not limited to three as described above, but can be any value equal to or greater than 1.

The p-side finger electrode 93 and the p-side electrode 92 are electrically connected with each other, via a p-side electrical connection 94. This p-side electrical connection 94 is adapted to pass through the non-conductive reflective film 91, at the lower portion of a region of the p-side electrode 92 adjacent to the n-side electrode 80, i.e., at the location of the connection 99 of the p-side finger electrode 93.

Moreover, the p-type semiconductor layer 50 and the p-side electrode 92 are directly connected, via a p-side direct-connection type electrical connection 104. The p-side direct-connection type electrical connection 104 is adapted to pass through the non-conductive reflective film 91, at the lower portion of a region of the p-side electrode 92 that is farther away from the n-side electrode 80 than the p-side electrical connection 94, i.e., from the lower portion of a region adjacent to the first side 101. While FIG. 4 and FIG. 7 each illustrate an embodiment where three p-side electrical connections 94 and three p-side direct-connection type electrical connections 104 are provided, it should be noted that these numbers can be modified, and may not necessarily be equal to each other. Meanwhile, similar to the connection 99 of the p-side finger electrode 93 arranged at the lower portion of the p-side electrical connection 94, a base electrode 106 of a relatively larger width can also be provided at the lower portion of the p-side director-connection type electrical connection 104. It is possible to form the base electrode 106 and the p-side finger electrodes 93 together, before forming the non-conductive reflective film 91. This base electrode 106 is not necessarily required, but may be omitted.

Prior to the formation of the non-conductive reflective film 91, the contact area 35 is formed as a result of the partial removal of the p-type semiconductor layer 50 and of the active layer 40 by a mesa etching process for exposing the n-type semiconductor layer 30. The contact area 35 can include a linear contact zone 31 and a dot-like contact zone 33. The linear contact zone 31 extends towards the p-side electrode from a region of the n-side electrode 80 adjacent to the p-side electrode 92, and it may reach the lower portion of the p-side electrode 92. The dot-like contact zone 33 is located at a region of the n-side electrode 80 far from the p-side electrode 92, i.e., at the lower portion of a region adjacent to the second side 102, being away from the linear contact zone. There are two linear contact zones 31 and two dot-like contact zones 33, with the two linear contact zones 31 extending between the p-side finger electrodes 92, in parallel with the p-side finger electrodes 92. The linear contact zone 31 and the dot-like contact zone 33 can extend in the lateral direction of the semiconductor light emitting device, but it is also possible that they are not open towards either side, and their circumferences are surrounded with the active layer 40 and the p-type semiconductor layer 50 and get blocked. While FIG. 4 and FIG. 7 each illustrate an embodiment where two linear contact zones 31 and two dot-like contact zones 33 are provided, it should be noted that these numbers can be modified, and may not necessarily be equal to each other. The linear contact zone 31 and the dot-like contact zone 33 may also be arrayed in various configurations.

N-side finger electrodes 81 are provided between the n-type semiconductor layer 30 within each linear contact zone 31, and the non-conductive reflective film 91. The n-side finger electrode 81 extends towards the p-side electrode 92 from the lower portion of the n-side electrode 80, along the linear contact zone 31. The n-side finger electrode 81 extends towards the p-side electrode 92 from the lower portion of a region of the n-side electrode 80 adjacent to the p-side electrode 92, and may reach the lower portion of the p-side electrode 92. That is, the n-side finger electrode 81 stretches out in the direction from the second side 102 to the first side 101 of the semiconductor light emitting device. The n-side finger electrode 80 can be divided into a long stretched finger part 88 and a connecting part 89 of a larger width. The connecting part 89 is located at the end of the second side 102 of the n-side finger electrode 81 that is arranged below a region of the n-side electrode 80 adjacent to the p-side electrode 92. Correspondingly, the linear contact zone 31 is adapted to have a smaller width at the section where the finger part 88 of the n-side finger electrode 81 is arranged, and to have a larger width at the section where the connecting part 89 of the n-side finger electrode 81 is arranged.

The n-side finger electrode 81 and the n-side electrode 80 are electrically connected with each other, via an n-side electrical connection 82. The n-side electrical connection 82 The n-side electrical connection 82 is adapted to pass through the non-conductive film 91, at the lower portion of a region of the n-side electrode 80 adjacent to the p-side electrode 92.

Moreover, the n-type semiconductor layer 30 within the dot-like contact zone 33 is directly connected with the n-side electrode 80, via an n-side direct-connection type electrical connection 112. The n-side direct-connection type electrical connection 112 is adapted to pass through the non-conductive reflective film 91, at the lower portion of a region of the n-side electrode 80 that is farther away from the p-side electrode 92 than the n-side electrical connection 82, i.e., at the lower portion of a region adjacent to the second side 102. While FIG. 4 and FIG. 7 each illustrate an embodiment where two n-side electrical connections 82 and two n-side direct-connection type electrical connections 112 are provided in accordance with the number of the linear contact zones 31 and the number of the dot-like contact zones 33, respectively, it should be noted that, as is the case with the linear contact zones 31 and the dot-like contact zones 33, those numbers of the electrical connections can be modified, and may not necessarily be equal to each other. Meanwhile, similar to the connection 89 of the n-side finger electrode 81 arranged at the lower portion of the n-side electrical connection 82, a base electrode 114 of a relatively larger width can also be provided at the lower portion of the n-side director-connection type electrical connection 112. It is possible to form the base electrode 114 and the n-side finger electrodes 81 together, before forming the non-conductive reflective film 91. This base electrode 114 is not necessarily required, but may be omitted.

As explained above, in the semiconductor light emitting device according to the present disclosure, in order to supply current to the p-type semiconductor layer 50 arranged below the non-conductive reflective film 91, current is supplied to the region below the p-side electrode 92 mainly via the p-side direct-connection type electrical connection 104, and current is supplied to the region below the n-side electrode 80 via the p-side finger electrode 93 which extends below the n-side electrode 80 and via the p-side electrical connection 94 which electrically connects the p-side electrode 92 with the p-side finger electrode 93. That is, a region where the p-side direct-connection type electrical connection 104 can be formed is supplied with current via the p-side direct-connection type electrical connection 104, and a region of the n-side electrode 80 as well as a region between the n-side electrode 80 and the p-side electrode 92 where the p-side direct-connection type electrical connection 104 cannot be formed are supplied with current via the p-side finger electrode 93 and the p-side electrical connection 94. Likewise, in order to supply current to the n-type semiconductor layer 30 arranged below the non-conductive reflective film 91, current is supplied to the region below the n-side electrode 80 mainly via the n-side direct-connection type electrical connection 112, and current is supplied to the region below the p-side electrode 92 via the n-side finger electrode 81 which extends below the p-side electrode 92 and via the n-side electrical connection 82 which electrically connects the n-side electrode 80 with the n-side finger electrode 81. That is, a region where the n-side direct-connection type electrical connection 112 can be formed is supplied with current via the n-side direct-connection type electrical connection 112, and a region of the p-side electrode 92 as well as a region between the n-side electrode 80 and the p-side electrode 92 where the n-side direct-connection type electrical connection 112 cannot be formed are supplied with current via the n-side finger electrode 81 and the n-side electrical connection 82.

Thus, the process of supplying current to the n-type semiconductor layer 30 and the p-type semiconductor layer 50 arranged below the non-conductive reflective film 91 is not entirely dependent upon the finger electrodes 81 and 93, and it is also possible to supply and spread the current in an effective manner to the region below the electrodes 80 and 92, via the direct-connection type electrical connections 112 and 104. In other words, as the n-side finger electrodes 81 do not extend to a region below the n-side electrode 80, and the p-side finger electrodes 93 do not extend to a region below the p-side electrode 92, it is possible to form relatively shorter finger electrodes 81 and 93. In result, light absorption by these finger electrodes will be reduced, and the light extraction efficiency can be improved.

Meanwhile, when the spread of current is more facilitated on the n-type semiconductor layer 30 as compared with the p-type semiconductor layer 50, the combination of the n-side finger electrode 81 and the n-side electrical connection 82 may be omitted, or the n-side direct-connection type electrical connection 112 may be omitted as well.

A suitable height for the p-side finger electrodes 93 and the n-side finger electrodes 81 ranges from 2 μm to 3 μm. If the finger electrodes are thinner than the range, it can lead to an increased operating voltage; and if the finger electrodes are thicker than the range, it can affect the stability of the process and increase the material cost.

Preferably, prior to the formation of the p-side finger electrode 93, optical absorption barriers 95 can be formed at the sections on the p-type semiconductor layer 50, which correspond to below the p-side finger electrode 93 and the p-side direct-connection type electrical connection 104, respectively. The optical absorption barrier 95 is formed in such a way that it is slightly wider than the p-side finger electrode 93 and the p-side direct-connection type electrical connection 104. The optical absorption barrier 95 serves to prevent the p-side finger electrode 93 and the p-side direct-connection type electrical connection 104 from absorbing light that is generated in the active layer 40. The optical absorption barrier 95 may only serve to reflect part or all of the light generated in the active layer 40, or may only serve to prevent the current from both the p-side finger electrode 93 and the p-side direct-connection type electrical connection 104 from flowing right below the p-side finger electrode 93 and the p-side direct-connection type electrical connection 104, or may serve both functions. To carry out these functions, the optical absorption barrier 95 can be composed of a single layer (e.g., $SiO_2$) or a multilayer (e.g., $SiO_2/TiO_2/SiO_2$) that is made of a light-transmitting material having a refractive index lower than that of the p-type semiconductor layer 50, or a DBR or a combination of the single layer and the DBR. In addition, the optical absorption barrier 95 can be composed of a non-conductive material (e.g., a dielectric film such as $SiO_x$, $TiO_x$ or the like). Depending on the structure, a suitable thickness for the optical absorption barrier 95 is between 0.2 μm and 3.0 μm. If the optical absorption barrier 95 is thinner than the range, it cannot function properly; and if the optical absorption barrier 95 is thicker than the range, it can be difficult to deposit the light-transmitting conductive film 60 on the optical absorption barrier 95. Although the optical absorption barrier 95 does not always have to be composed of a light-transmitting material or of a non-conductive material, the effects thereof can be increased by incorporating a light-transmitting dielectric material.

Preferably, the light-transmitting conductive film 60 may be formed on the p-type semiconductor layer 50, following the formation of the optical absorption barrier 95 yet prior to the formation of the p-side finger electrode 93. The light-transmitting conductive film 60 is formed on the p-type semiconductor layer 50 in such a way that it covers almost the entire p-type semiconductor layer, except for the contact area 35 that is formed by a mesa etching process. As such, the optical absorption barrier 95 is interposed between the light-transmitting conductive film 60 and the p-type semiconductor layer 50. Especially in case of a p-type GaN, it has a poor current spreading capability. Also, when the p-type semiconductor layer 50 is composed of GaN, the light-transmitting conductive film 60 should be incorporated in most cases. For instance, materials such as ITO, Ni/Au or the like can be used for the light-transmitting conductive film 60. After the light-transmitting conductive film 60 is formed, the p-side finger electrode 93 can be formed on the light-transmitting conductive film 60 where the optical absorption barrier 95 is placed, and the n-side finger electrodes 81 are formed within the contact area 35.

Following the formation of the n-side finger electrode 81 and the p-side finger electrode 93, the non-conductive reflective film 91 is formed in such a way that the contact area 35 including the linear contact zone 31 and the dot-like contact zone 33, as well as the p-type semiconductor layer 50 including the p-side finger electrodes 93 are covered overall. The non-conductive reflective film 91 serves to reflect light from the active layer 40 towards the substrate 10 used for the growth or towards the n-type semiconductor layer 30 if the substrate 10 has been removed. Preferably, the non-conductive reflective film 91 also covers the exposed side faces of the p-type semiconductor layer 50 and the active layer 40 that connect the upper face of the p-type semiconductor layer 50 and the upper face of the contact area 35. A person skilled in the art should understand that it is not absolutely necessary for the non-conductive reflective film 91 to cover the entire area over the exposed n-type semiconductor layer 30 as a result of etching and the p-type semiconductor layer 50 on the opposite side of the substrate 10. For instance, the n-type semiconductor layer 30 that is exposed by etching, i.e. the contact area 35 may not be covered with the non-conductive reflective film 91.

The non-conductive reflective film 91 serves as a reflective film, yet it can preferably be composed of a light-transmitting material, for example, a light-transmitting dielectric material such as $SiO_x$, $TiO_x$, $Ta_2O_5$ or $MgF_2$, in order to avoid the light absorption. The non-conductive reflective film 91 can have a variety of structures, including a single dielectric film for example made of a light-transmitting dielectric material such as $SiO_x$, a single DBR for example including the combination of $SiO_2$ and $TiO_2$, heterogeneous plural dielectric films and any combination of a dielectric film and a DBR, and can have a thickness ranging from 3 to 8 μm, for example. The dielectric film having a refractive index lower than that of the p-type semiconductor layer 50 (e.g., GaN) can reflect part of the light having an incidence angle greater than a critical angle towards the substrate 10, the DBR can reflect a greater amount of light towards the substrate 10, and the DBR can also be designed for a specific wavelength such that it can efficiently reflect light in response to the wavelength of the light generated.

Preferably, as shown in FIG. 5 and FIG. 6, the non-conductive reflective film 91 has a double layer structure including a DBR 91a and a dielectric film 91b. As the deposition of the DBR 91a needs to be done with high precision, the dielectric film 91b having a uniform thickness is first formed before the deposition such that the DBR 91b can be prepared in a stable manner, and light reflection can also benefit therefrom.

During the formation of a semiconductor light emitting device according to the present disclosure, a step (step-shape portion) having height difference can be created by a mesa etching process for forming the n-side contact area 31, a component such as the p-side finger electrode 93 or the n-side finger electrode 81 with a step is required, and even after the non-conductive reflective film 91 is formed, it should be subjected to a boring process to make an opening in it as described in detail below. Thus, special attention should be paid during the formation of the dielectric film 91b.

The dielectric film 91b is suitably made of $SiO_2$, and it preferably has a thickness between 0.2 μm and 1.0 μm. If the dielectric film 91b is thinner than the range, it is not enough to fully cover the n-side finger electrode 81 and p-side finger electrode 93 having a height ranging from 2 μm to 3 μm; and if the dielectric film 91b is thicker than the range, the subsequent boring process can be difficult to perform. The dielectric film 91b may be thicker than the following DBR 91a. Moreover, it is necessary to form the dielectric film 91b by a more suitable method for ensuring the reliability of the device. For instance, the dielectric film 91b made of $SiO_2$ is preferably formed by CVD (Chemical Vapor Deposition) and in particular by PECVD (Plasma Enhanced CVD). This is because the steps are created during the formation of the contact area 35 by mesa etching, the p-side finger electrode 93 and the n-side finger electrode 81, and because the CVD is more advantageous than PVD (Physical Vapor Deposition) such as E-beam evaporation to cover the steps. More specifically, when the dielectric film 91b is formed by E-beam evaporation, the dielectric film 91b can be formed more thinly on the lateral faces of the p-side finger electrode 93 and n-side finger electrode 81 having the step, or on the tilted step face generated by mesa etching. Meanwhile, if a thinner dielectric film 91b is formed on the step faces, and especially if the p-side finger electrode 93 and the n-side finger electrode 81 are arranged below the p-side electrode 92 and the n-side electrode 80 respectively, a short might occur between the electrodes. Therefore, in order to ensure insulation, the dielectric film 91b is preferably formed by CVD. In this way, it is possible to secure the reliability of the semiconductor light emitting device, while ensuring those functions as the non-conductive reflective film 91.

The DBR 91a is formed on the dielectric film 91b and compose the non-conductive reflective film 91, together with the dielectric film 91b. For example, the DBR 91a having a repeatedly laminated structure composed of the combination of $TiO_2/SiO_2$ is preferably formed by PVD, and in particular by E-beam evaporation, sputtering or thermal evaporation.

For example, when the DBR 91a is composed of the combination of $TiO_2/SiO_2$, each layer is designed to have an optical thickness of one fourth of a given wavelength. However, if an optimal design can be obtained in consideration of the influence on the incident angle of light and of the wavelength of light 9 (blue, green, yellow, red, etc.) that can be generated inside a package, it would not be required to keep the thickness of each layer precisely at ¼ of the wavelength, and the number of the combinations thereof is suitably in a range of from 4 to 20 pairs. If the number of pairs is smaller than the range, the reflectivity of the DBR may be degraded; while if the number of pairs is larger than the range, the DBR may become excessively thick. Also, each layer is basically designed to have an optical thickness of ¼ of a given thickness, but, depending on the wavelength band of interest, it can certainly be designed in a greater thickness than ¼ of the given wavelength. Additionally, the DBR 91a may also be designed in combination of $TiO_2$ layers/$SiO_2$ layers having different optical thicknesses, respectively. In short, the DBR 91a can include plural combinations of $TiO_2$ layers/$SiO_2$ layers repeatedly laminated, and these plural combinations of $TiO_2$ layers/$SiO_2$ layers can have different optical thicknesses from one another.

With the non-conductive reflective film 91 thus formed, the p-side finger electrode 93 and the n-side finger electrode 81 are fully covered by the non-conductive reflective film 91. To enable the p-side finger electrode 93 and the n-side finger electrode 81 to electrically communicate with the p-side electrode 92 and the n-side electrode 80, openings passing through the non-conductive reflective film 91 are formed, and the openings are then filled with an electrode material to form electrical connections 94 and 82 in a corresponding structure. Further, to enable the p-side electrode 92 and the n-side electrode 80 to be direct communication with the light-transmitting conductive film 60 and the n-type semiconductor layer 30, respectively, openings passing through the non-conductive reflective film 91 are formed, and the openings are then filled with an electrode material to form direct-connection type electrical connections 104 and 112 in a corresponding structure. These openings are preferably formed by dry etching or wet etching or both. As the p-side finger electrode 93 and the n-side finger electrode 81 have narrow-width finger parts 98 and 88 respectively, the electrical connections 94 and 82 are preferably formed on the connecting parts 99 and 89 of the p-side finger electrode 93 and the n-side finger electrode 81, respectively.

Once the electrical connections 94 and 82 are formed, the p-side electrode 92 and the n-side electrode 80 are then formed on the non-conductive reflective film 91. Considering that the p-side electrode 92 and the n-side electrode 80 contribute to reflecting light from the active layer 40 towards the substrate 10, those electrodes can be formed over a broad area to be able to cover the entire or almost the entire upper face of the non-conductive reflective film 91, thereby serving as a conductive reflective film. However, the p-side electrode 92 and the n-side electrode 80 are preferably formed at a distance from each other on the non-conductive reflective film 91. As such, there exists a portion on the non-conductive reflective film 91, which is covered neither by the p-side electrode 92 nor by the n-side electrode 80. The p-side electrode 92 and the n-side electrode 80 formed on the non-conductive reflective film 91 can have the same area or different areas from each other. When the spread of current is more facilitated on the n-type semiconductor layer 30 as compared with the p-type semiconductor layer 50, the p-side electrode 92 may be adapted to have a larger width than that of the n-side electrode 80 in the extension of the finger electrodes 81 and 93. Meanwhile, when the contact area 35 is not covered with the non-conductive reflective film 91, the n-side electrode 80 may be formed within the contact area 35, rather than over a broad area.

While the p-side electrode 92 or the n-side electrode 80 may suitably be made of a material having an acceptable reflectance (e.g., Al, Ag or the like), it is preferably made of the combination of the high-reflectance material (e.g., Al, Ag or the like) and Cr, Ti, Ni, Au or any alloy thereof for obtaining a stable electrical contact.

The p-side electrode 92 and the n-side electrode 80 serve to supply current to the p-side finger electrode 93 and the n-side finger electrode 82; to connect the semiconductor light emitting device with external equipment; and, by occupying a broad area, to reflect the light from the active layer 40 and/or emit the heat. Therefore, forming both the p-side electrode 92 and the n-side electrode 81 on the non-conductive reflective film 91 makes it possible to minimize the height difference between the p-side electrode 92 and the n-side electrode 80, and is advantageous when the semiconductor light emitting device according to the present disclosure is bonded to a mount part (e.g., a PCB, a sub-mount, a package or a COB). This advantage becomes more apparent especially when the eutectic bonding method is applied. Moreover, instead of incorporating the p-side electrode 92 and the n-side electrode 80 into the semiconductor light emitting device, it is possible to form them on the mount part where the semiconductor light emitting device is to be installed.

As the p-side electrode 92 and the n-side electrode 80 are formed over a broad area on the non-conductive reflective film 91, with the p-side finger electrode 93 and the n-side finger electrode 81 being arranged below the non-conductive reflective film 91, the p-side finger electrode 93 stretches out, passing below the n-side electrode 80 placed directly on the non-conductive reflective film 91, and the n-side finger electrode 81 stretches out, passing below the p-side electrode 92 placed directly on the non-conductive reflective film 91. As the non-conductive reflective film 91 exists between the p-side electrode 92 and the p-side finger electrode 93, and between the n-side electrode 80 and the n-side finger electrode 81, a short between the electrodes 92 and 80 and the finger electrodes 93 and 81 can be prevented. Further, by introducing the p-side finger electrode 93 and the n-side finger electrode 81 as described above into the formation of a flip-chip, it becomes possible to supply current to the semiconductor layer areas of interest, without restriction.

In general, the p-side electrode 92, the n-side electrode 80, the p-side finger electrode 93 and the n-side finger electrode 81 are composed of a plurality of metal layers, respectively. In case of the p-side finger electrode 93, the bottom layer thereof should have a high bonding strength with the light-transmitting conductive film 60. To this end, materials such as Cr or Ti are mainly used, but other materials such as Ni, Ti or TiW can also be used as there are no particular limitations regarding this matter. A person skilled in the art should understand that Al or Ag having a high reflectance can also be employed for the p-side finger electrode 93 and the n-side finger electrode 81.

In case of the p-side electrode 92 and the n-side electrode 80, Au is used for their top layers for wire bonding or for the connection with an external electrode. Also, for a good compromise in regard to the reduction of the amount of Au used and reinforcing the relatively low hardness of Au, other metals may also be employed depending on the bonding method, although Au might as well be employed for the top layers of the p-side electrode 92 and the n-side electrode 80, for the connection with an external electrode. Examples of other metals that can be used include Sn, Ni, Ti, Pt, W, TiW, Cu, or any alloy thereof, but are not limited thereto. In addition, as for a material between the bottom layer and the top layer, Ni, Ti, TiW or W can be employed according to the specifications required, or Al or Ag can be employed when a high reflectance is required. In the present disclosure, since the p-side finger electrode 93 and the n-side finger electrode 81 need to be electrically connected with the electrical connections 94 and 82, Au could be considered for use as the top layers for finger electrodes 93 and 81. However, the inventors found out that it is not appropriate to use Au as the top layers for the p-side finger electrode 93 and the n-side finger electrode 81, because the Au gets easily peeled off due to a weak bonding strength between the Au and the non-conductive reflective film 91 at the time of deposition of the non-conductive reflective film 91 onto the Au top layer. To resolve this problem, other material such as Ni, Ti, W, TiW, Cr, Pd or Mo can be employed in replace of Au to form the top layers of the finger electrodes. In this way, the bonding strength between the top layers and the non-conductive reflective film 91 to be deposited on the top layers is retained and the reliability can thus be improved. Further, those metals mentioned above are fully capable of functioning as a diffusion barrier during the formation of an opening in the non-conductive reflective film 91 to create the electrical connection 94, which can be helpful for ensuring the stability of the subsequent processes and the electrical connects 94 and 82.

Figure 8:
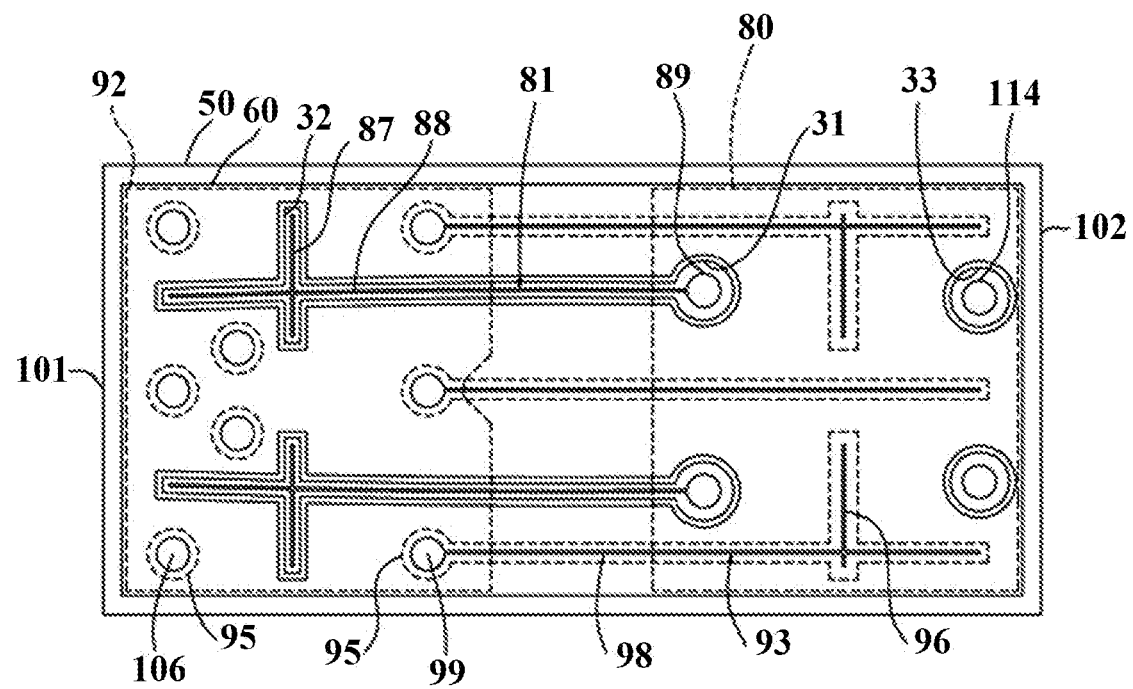
FIG. 8 is a view illustrating another example of the semiconductor light emitting device according to the present disclosure.

FIG. 8 is a view illustrating yet another example of the semiconductor light emitting device according to the present disclosure.

The p-side finger electrode 93 has an extension finger part 96 that extends, additionally, from the lower portion of the n-side electrode 80, at an angle with the finger part 98. The extension finger part 96 preferably extends to a region between the linear contact zone 31 and the dot-like contact zone 33. The extension finger part 96 may extend from the center of the finger part 98 as depicted in FIG. 8, but it may also extend from the end of the second side 102 of the finger part 98. Moreover, the extension finger part 96 may extend at right angles with the finger part 98 as depicted in FIG. 8, it may also extend at different angles. In addition, the extension finger part 96 may extend at right angles with the finger part 98 in one direction only as depicted in FIG. 8, it may also extend to both directions. Further, only some of the plurality of p-side finger electrodes 93 can have such an extension finger part 96 as depicted in FIG. 8, or every p-side finger electrodes 93 can have such an extension finger part 96.

The n-side finger electrode 81 also has an extension finger part 87 that extends, additionally, from the lower portion of the p-side electrode 92, at an angle with the finger part 98. The extension finger part 87 preferably extends to a region between the p-side electrical connection 94 and the p-side direct-connection type electrical connection 104. To form the extension finger part 87 of the n-side finger electrode 81, the linear contact zone 31 would have to have an additional extension contact zone 32 that extends, additionally, along a region where the extension finger part 87 is to be arranged. The extension finger part 87 may extend from the center of the finger part 88 as depicted in FIG. 8, but it may also extend from the end of the first side 101 of the finger part 88. Moreover, the extension finger part 87 may extend at right angles with the finger part 88 as depicted in FIG. 8, it may also extend at different angles. In addition, the extension finger part 87 may extend in both directions as depicted in FIG. 8, it may also extend in one direction only. Further, every n-side finger electrodes 81 can have such an extension finger part 87 as depicted in FIG. 8, or only some of the plurality of n-side finger electrodes 81 can have such an extension finger part 87.

The number of the p-side direct-connection type electrical connections 104 provided may be larger (as depicted in FIG. 8) or smaller than the number of the p-side electrodes 93. Also, it is not absolutely required to put those p-side direct-connection type electrical connections 104 in a row.

Figure 9:
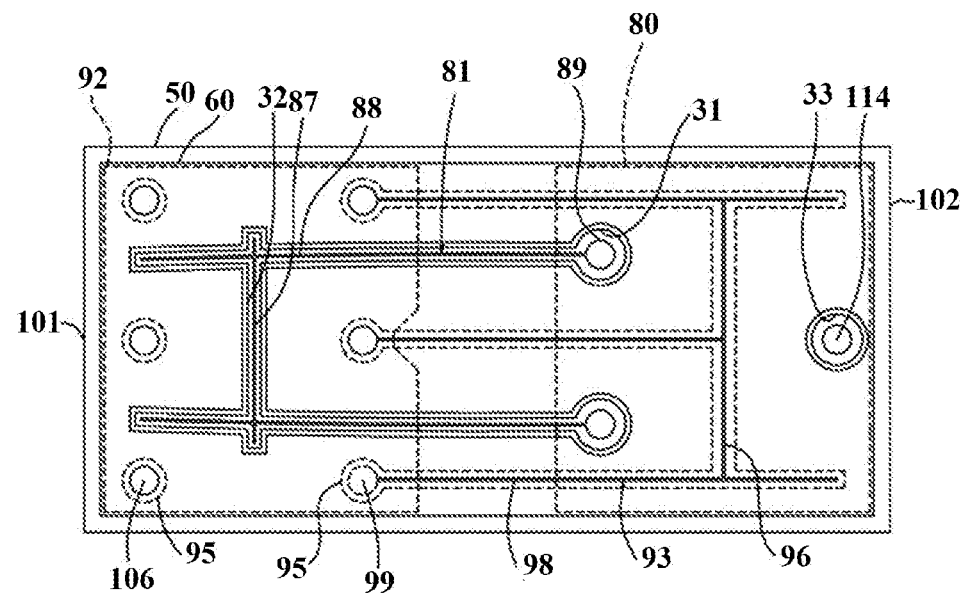
FIG. 9 is a view illustrating yet another example of the semiconductor light emitting device according to the present disclosure.
Figure 10:
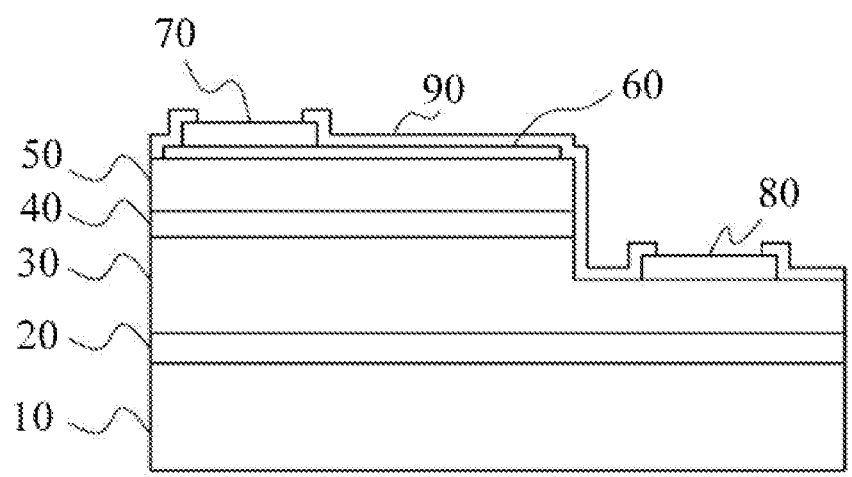
FIG. 10 is a view illustrating an example of the semiconductor light emitting device in the prior art.

FIG. 9 is a view illustrating another example of the semiconductor light emitting device according to the present disclosure.

The extension finger parts 96 present in the plurality of p-side finger electrodes 93 can be interconnected at the lower portion of the n-side electrode 80. That is, these extension finger parts 96 can be connected with each other.

Likewise, the extension finger parts 87 available in the plurality of n-side finger electrodes 81 can be interconnected at the lower portion of the p-side electrode 92. Here, those additional extension contact zones 32 available in the plurality of linear contact zones 31 would have to be interconnected as well.

In addition, as shown in FIG. 9, it is not absolutely required that all of the p-side finger electrodes 93 should have the same length. Also, the number of the n-side direct-connection type electrical connections 112 may be smaller or larger than the number of the n-side finger electrodes 81.

Figure 11:
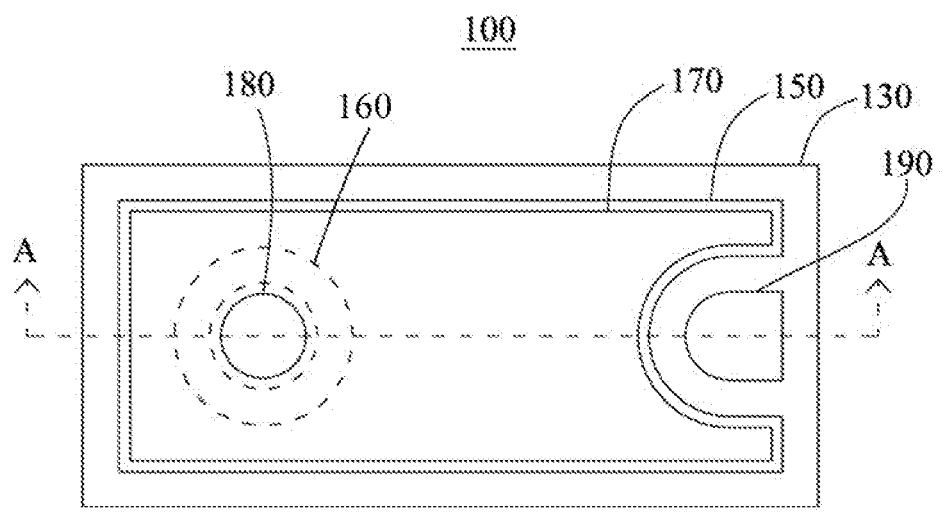
FIG. 11 is a view illustrating one example of the semiconductor light emitting device according to the present disclosure.
Figure 12:
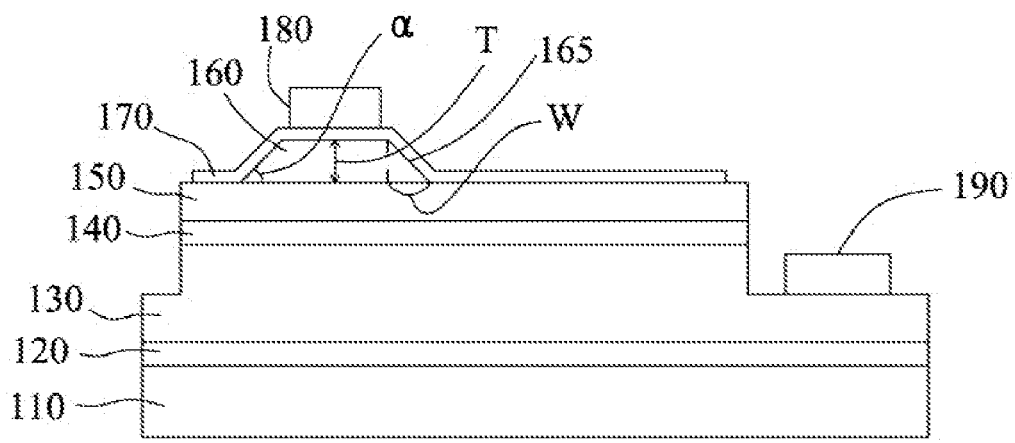
FIG. 12 is a cross section view taken along line A-A of FIG. 11.

FIG. 11 is a view illustrating yet another example of the semiconductor light emitting device according to the present disclosure, and FIG. 12 is a cross section view taken along line A-A of FIG. 12.

As shown in FIG. 11 and FIG. 12, a semiconductor light emitting device 100 includes a substrate 110, a buffer layer 120, a first semiconductor layer 130, an active layer 140, a second semiconductor layer 150, a current blocking layer 160, a current-spreading conductive film 170, a first electrode 180 and a second electrode 190.

On the substrate 110, the buffer layer 120, the first semiconductor layer 130 having a first conductivity, the active layer 140 generating light via electron-hole recombination, and the second semiconductor layer 150 having a second conductivity different from the first conductivity are formed in the order mentioned.

The current-spreading conductive film 170 is arranged on the second semiconductor layer 150, and the first electrode 180 is arranged on the current-spreading conductive film 170. The current blocking layer 160 is interposed between the second semiconductor layer 150 and the current-spreading conductive film 170, e.g. below the first electrode 180. That is, the current blocking layer 160 is formed on the second semiconductor layer 150, and the current-spreading conductive film 170 is adapted to cover both the current blocking layer 160 and the second semiconductor layer 150.

Those semiconductor layers epitaxially growing on the substrate 110 are mainly grown by MOCVD (Metalorganic Chemical Vapor Deposition), and if necessary, each of the layers can further comprise sub-layers. The substrate 110 may be a homogeneous substrate, such as a GaN-based substrate, or a heterogeneous substrate, such as a sapphire substrate, a SiC substrate or a Si substrate, but any type of the substrate is acceptable as long as a group III nitride semiconductor layer can be grown thereon. The substrate 110 can eventually be removed, and the buffer layer 120 can be omitted. When the substrate 110 is to be removed or has conductivity, the second electrode 190 can be formed on the side of the first semiconductor layer 130 after the substrate 110 has been removed therefrom, or on the side of the substrate 110 having conductivity. The first semiconductor layer 130 and the second semiconductor layer 150 are adapted to have different conductivities from each other. The first semiconductor layer 130 can be an n-type semiconductor layer 130 (e.g., an n-type GaN layer), and the second semiconductor layer 150 can be a p-type semiconductor layer 150 (e.g., a p-type GaN layer), or they could also be the other way around.

Once the first semiconductor layer 130, the active layer 140 and the second semiconductor layer 150 are formed, the second semiconductor layer 150 and the active layer 140 are etched into mesa form such that the first semiconductor layer 130 is exposed. Dry etching, such as ICP (Inductively Coupled Plasma) for example may suitably be used for removing several semiconductor layers. Then the second electrode 190 is placed on top of the semiconductor layer 130 thus exposed.

The current blocking layer 160 can be made of an insulating material, and preferably of a light-transmitting dielectric material having a lower refractive index than that of the first semiconductor layer 150 (e.g., a p-type GaN layer) the current blocking layer 160 is brought into contact with. The current blocking layer 160 can be made of at least one selected from the group consisting of $SiO_x$, $TiO_x$, $Ta_2O_5$, $MgF_2$, SiN, SiON, $Al_2O_3$, $AlO_x$ and $NiO_x$, for example. Further, the current blocking layer 160 can include a DBR. For a specific example, the current blocking layer 160 can have diverse configurations which include a homogeneous dielectric film composed of a light-transmitting dielectric material such as $SiO_x$ and $TiO_x$, heterogeneous dielectric films having different refractive indices (e.g., $SiO_2/TiO_2$, $SiO_2/Ta_2O_5$, $SiO_2/TiO_2/Ta_2O_5$, etc.), a single DBR having a combination of $SiO_2/TiO_2$ or $SiO_2/Ta_2O_5$, a combined DBR-dielectric film, and the like. When the current blocking layer 160 is composed of plural dielectric films or includes a DBR, each layer can be designed to have a reflectance of at least 90% in the LED wavelength band. When the current blocking layer 160 is composed of a DBR only, the DBR could have a relatively larger number of combinations; when the current blocking layer 160 is composed of a combination of the DBR and a dielectric film such as $SiO_2$, the DBR could have a relatively smaller number of combinations. Accordingly, when the current blocking layer 160 has a DBR, it is still possible to prevent light absorption in an efficient manner even if the current blocking layer 160 is made relatively thinner.

The current-spreading conductive film 170 is light transmissive, and improves the light distribution uniformity. The current-spreading conductive film 170 is usually made of an ITO or Ni/Au oxide. Even if the current-spreading conductive film 170 is the most common ITO film, it still absorbs part of the light generated in the active layer 140, such that the current-spreading conductive film 170 is preferably made thinner. However, when the current-spreading conductive film 170 is too thin, an increase in the operating voltage may occur which in turn makes it inappropriate. As such, a suitable thickness range of the current-spreading conductive film 170 for facilitating current spreading without increasing the operating voltage, while minimizing the absorption of light generated is between 200 Å and 1000 Å.

The current blocking layer 160, which is made of an insulating material and thus has a very high resistance, is advantageous in that it can block the current flowing into the active layer 140 arranged at the lower portion of the first electrode 180, thereby reducing the loss of light due to the first electrode 180. Here, the current is spread through the current-spreading conductive film 170. Moreover, the current blocking layer 160 is also involved in the prevention of light absorption by the first electrode 180. As the current blocking layer 160 is made of a material having a lower refractive index than that of the material of the second semiconductor layer 150, light generated in the active layer 140 is reflected from the interface between the second semiconductor layer 150 and the current blocking layer 160, which makes it possible to reduce light absorption by the first electrode 180. In particular, a critical angle is determined by the difference in refractive index between the second semiconductor layer 150 and the current blocking layer 160. Any incident light entering within the critical angle is reflected from the interface at a certain amount only, while any incident light entering at an angle greater than the critical angle is fully reflected. Accordingly, it is possible to reduce the amount of light absorbed by the first electrode 180. The medium where the light enters should have a thickness comparable to the wavelength of light, in order to make the refractive index of the medium exhort its influence accordingly. Thus, considering that the second semiconductor layer 150 composed of p-type GaN has a refractive index of approximately 2.4, the current blocking layer 160 composed of $SiO_2$ has a refractive index of approximately 1.5, and the current-spreading conductive film 170 composed of ITO has a refractive index between 1.8 and 2.0, any thin current blocking layer 160 would not be so effective in terms of inhibiting the light absorption by the first electrode 180. As such, the current blocking layer 160 should preferably have a sufficient thickness T, and the external quantum efficiency gets better with a larger reflectance between the first semiconductor layer 150 and the current blocking layer 160.

The current blocking layer 160 is provided in an island form below the first electrode 180. When the current blocking layer 160 has an excessively large width, the portion of an area in the device where current is not supplied is so high that the efficiency of the device can be degraded, and the incident light on the current blocking layer 160 from the active layer 140 may be reflected back to the substrate 110 in an amount more than necessary. Meanwhile, when the current blocking layer 160 has a small width, the incident light on the first electrode 180 cannot be reflected in an efficient manner. As such, the current blocking layer 160 preferably has a width equal to or slightly larger than the width of the first electrode 180.

Figure 13:
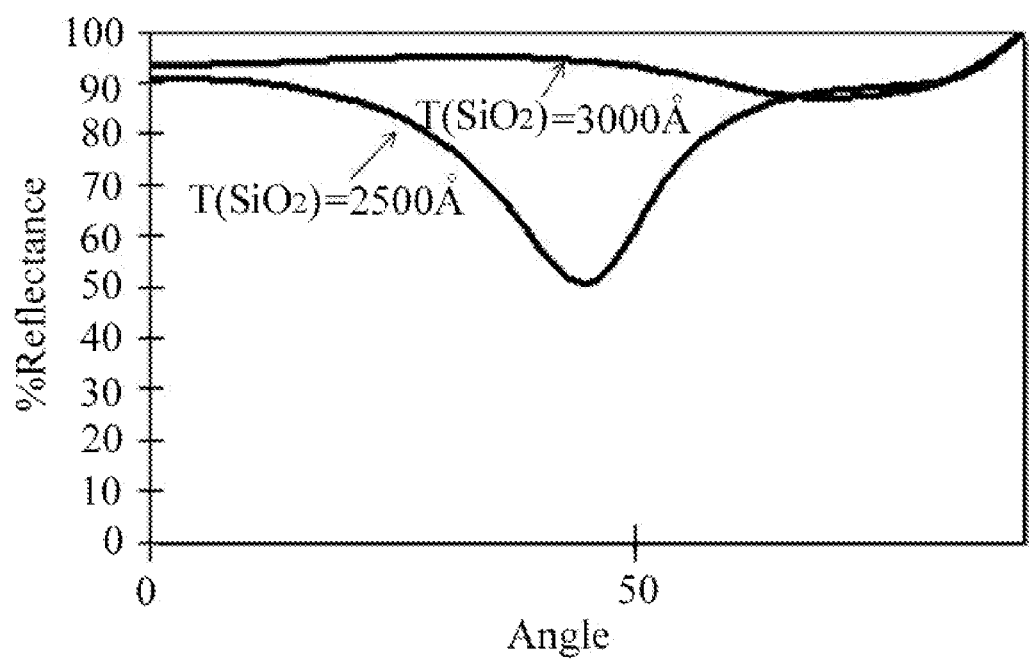
FIG. 13 is a graph of the simulation result, showing the relation between the thickness of a current blocking layer and the reflectance.

FIG. 13 is a graph of the simulation result, showing the relation between the thickness of a current blocking layer and the reflectance. In FIG. 13, the horizontal axis of the graph represents incidence angles of light incident on the current blocking layer 160, and the vertical axis of the graph represents reflectances. The simulation was carried out by varying the thickness of the current blocking layer 160 made of $SiO_2$. By way of example, FIG. 13 shows the simulation results of the layer of 2500 Å and 3000 Å in thickness. One can see that there is no significant difference in the reflectances by thickness T of the current blocking layer 160, when the incidence angle is either too large or too small. However, when the light is incident at an oblique angle approximately between 25 and 70 degrees, it is found that the reflectances vary considerably according to the thickness T of the current blocking layer 160. That is, when the thickness T of the current blocking layer 160 is smaller than 3000 Å, a sharp decrease in the reflectance is observed; and when the thickness T of the current blocking layer 160 is at least 3000 Å, high reflectances were observed, irrespective of the incidence angles. As such, it has been proved that the thickness T of the current blocking layer 160 can affect the reflective efficiency of light, and a desirable thickness range of the current blocking layer 160 for efficient reflection of the light is 3000 Å or higher.

The current blocking layer 160 also has inclined faces 165 at the edges. The inclined face 165 of the current blocking layer 160 preferably forms a gentle slope a at an angle of 45° or below, with respect to the top face of the second semiconductor layer 150. For instance, this inclined face 165 having a gentle slope of 45° or below can be obtained when the thickness T of the current blocking layer 160 is in a range between 3000 Å and 20000 Å (between 0.3 μm and 2 μm), both ends inclusive.

When the lateral faces of the current blocking layer 160 are in form of inclined faces 165 as described above, it is possible to prevent the loss of the current-spreading conductive film 170. More specifically, in situations where the current blocking layer 160 and the current-spreading conductive film 170 have different thermal expansion coefficients from each other, and where high-output semiconductor light emitting devices today tend to generate more heat during the light emitting process, if the current blocking layer 160 is made thick, while the current-spreading conductive film 170 is rather very thin, the current-spreading conductive film 170 is likely to get damaged (e.g., locally cut). More specifically, when the lateral faces of the current blocking layer 160 are tilted at right angles or nearly at right angles, thus creating a sharp turn on the current-spreading conductive film 170 (e.g., at the corner where the lateral face of the current blocking layer cross with the top face thereof), the current-spreading conductive film 170 is much more likely to get damaged by such an irregular expansion caused by the difference in thermal expansion coefficients. However, as described above, when the current blocking layer 160 has gently sloped, inclined faces 165 at its edges, it is possible to mitigate the sharp turn of the current-spreading conductive film 170, and to avoid damages on the current-spreading conductive film 170 caused by the difference in the thermal expansion coefficients, which in turn can prevent an increase in the operating voltage due to the damage on the current-spreading conductive film 170.

This current blocking layer 160 is formed, on the second semiconductor layer, by, for example, PECVD (Plasma Enhanced Chemical Vapor Deposition), LPCVD (Low Pressure Chemical Vapor Deposition), Sputtering, E-beam evaporation, or thermal evaporation, and then any unnecessary parts are removed therefrom. The latter process can be carried out by wet etching for example, and as a result, the current blocking layer 160 is provided with those inclined faces 165 at the edges.

Figure 14:
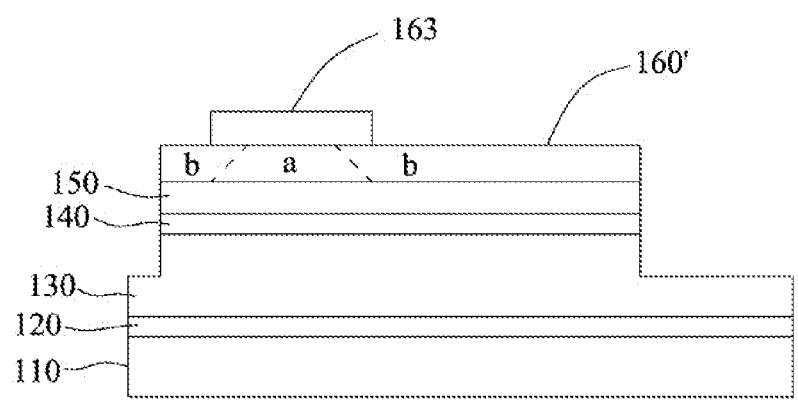
FIG. 14 to FIG. 16 are views illustrating how to form a current blocking layer with inclined faces.
Figure 15:
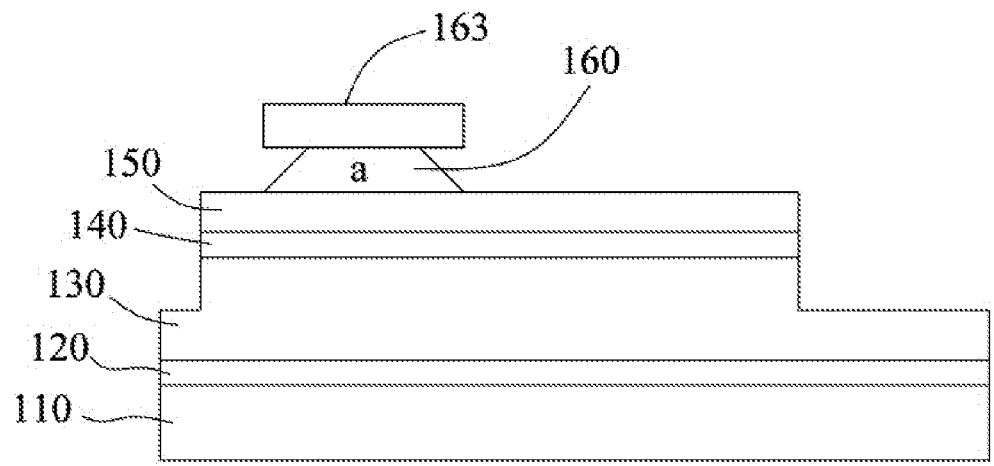
Figure 16:
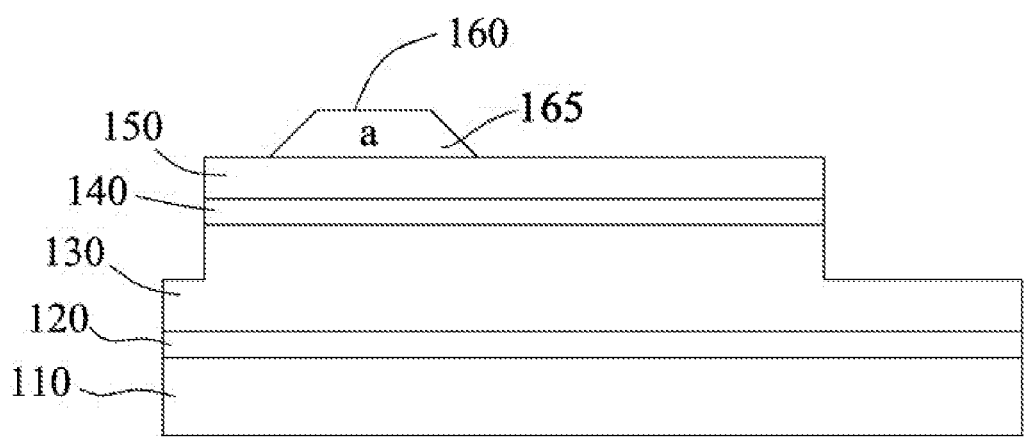

FIG. 14 to FIG. 16 FIG. 16 are views illustrating how to form a current blocking layer with inclined faces. More specifically, in order to form a current blocking layer 160 having inclined faces 165, first, a current blocking layer 160' is formed in such a way that it covers a second semiconductor layer 150, as depicted in FIG. 14. This current blocking layer 160' is divided into an area to be remained (a), and areas to be removed (b), and then a mask 163 for covering the area to be remained (a) is formed. This mask 163 can be composed of photoresist. Next, wet etching is carried out, and the areas to be removed (b), having not been covered with the mask 163, are then removed, as depicted in FIG. 15. After that, as depicted in FIG. 16, the mask 163 is removed such that only the current blocking layer in the area to be remained (a) is left on the second semiconductor layer 150. In this wet etching process, inclined faces 165 are formed at the edges of the remaining, current blocking layer 160 arranged below the edges of the mask 163. More specifically, while the current blocking layer in the areas to be removed (b) is brought into contact with an etchant, thus being gradually removed from top to bottom, the lateral faces of the current blocking layer in the area to be remained (a) that is arranged below the edges of the mask 163 are gradually exposed to the etchant in a downward direction. As such, during the etching process, the etchant horizontally penetrates further into the top portion of the current blocking layer in the area to be remained (a) at a greater depth, and the etchant penetrates less towards the bottom portion of the current blocking layer. In other words, the top portion of the current blocking layer to be remained (a), having contacted with the etchant much at the edges, is removed relatively more, and this removal rate decreases further down the current blocking layer (a), thereby forming the inclined faces 165 at the edges of the remaining current blocking layer (a). One possible way to make the inclined faces have a gentler slope is, for example, to reduce adhesion between the photoresist used as the mask 163 and the SiO$_2$ layer serving as the top layer of the current blocking layer (a). In this case, the etchant penetrates into the bottom of the photoresist instead, such that the inclined faces 165 may have a much gentler slope. In order to mitigate the adhesion between the photoresist and the SiO$_2$ layer, the photoresist is put on top of the SiO$_2$ layer in the absence of a process using HMDS Hexa Methyl Di Silazane, Si$_2$(CH$_3$)$_6$) which is typically performed to increase the adhesion, or a wet etching process is carried out, while maintaining the temperature of the etchant in a temperature range above the ambient temperature, such as between 30° C. and 50° C.

Following the formation of the current blocking layer 160, a current-spreading conductive film 170 is formed by sputtering, E-beam evaporation, thermal evaporation and the like, to cover practically the entire face of the second semiconductor layer 150 as well as the current blocking layer 150. A high-quality current-spreading conductive film 170 can easily be obtained by forming those inclined faces 165 of a gentle slope (a) at the edges of the current blocking layer 160. More specifically, when the lateral faces of the current blocking layer 160 are tilted at right angles or nearly at right angles, it is difficult to obtain a high-quality current-spreading conductive film 170 on the lateral faces of the current blocking layer 160, and it is even more difficult to form a thin and high-quality, current-spreading conductive film 170. However, with those inclined faces of a gentle slope formed at the edges of the current blocking layer 160 as described above, it is now easier to obtain a thin and high-quality, current-spreading conductive film 170

Next, a first electrode 180 and a second electrode 190 are formed by sputtering, E-beam evaporation, thermal evaporation or the like. The first electrode 180 and the second electrode 190 can be formed, for example, by laminating chrome, nickel and gold. The second electrode 190 is formed on a mesa-etched exposed portion of the first semiconductor layer 130, and the first electrode 180 is formed on the current-spreading conductive film 170 that is arranged on the current blocking layer 160. For instance, the first electrode 180 and the second electrode 190 may be arranged on opposite sides as shown in FIG. 11, but they can vary in shape and arrangement, without being limited thereto.

Figure 17:
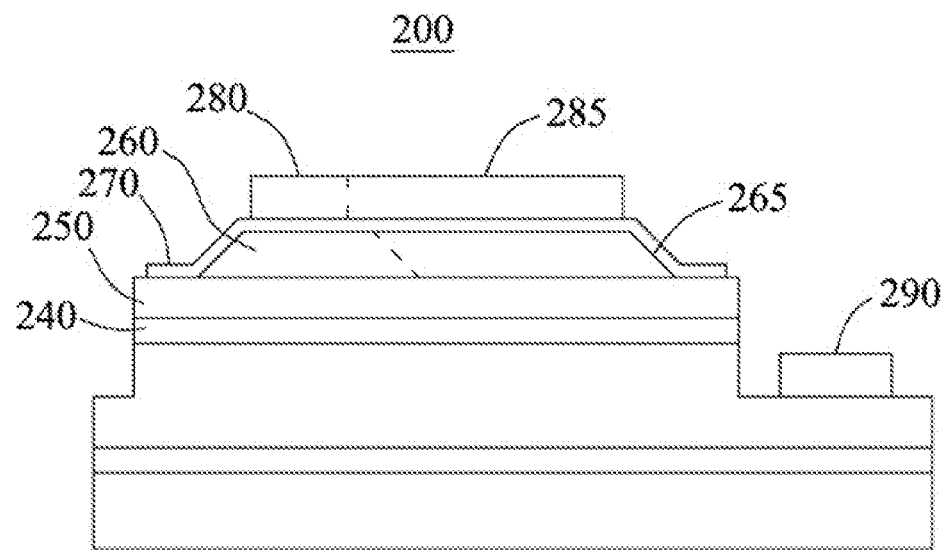
FIG. 17 is a view illustrating yet another example of the semiconductor light emitting device according to the present disclosure.

FIG. 17 is a view illustrating yet another example of the semiconductor light emitting device according to the present disclosure.

The semiconductor light emitting device 200 is substantially identical with the semiconductor light emitting device 100 illustrated in FIG. 11 and FIG. 12, except that the former further includes a first finger electrode 285. Accordingly, like reference numerals are used to refer to like elements, and their descriptions will not be repeated here.

As aforementioned, the semiconductor light emitting device 200 further includes, on the current-spreading conductive film 270, a first finger electrode 285 extending from the first electrode 280. The first finger electrode 285 promotes a smooth spreading of current, via an excellent electrical contact with the current-spreading conductive film 270. In this case, as the first finger electrode 285 itself absorbs part of the light generated in the active layer 240, the current blocking layer 260 extends, from between the second semiconductor layer 250 and the current-spreading conductive film 270, down to the first electrode 280 and even to the first finger electrode 285. Needless to say, the edges of the current blocking layer 260 arranged below the first finger electrode 285 are formed of inclined faces 265.

Figure 18:
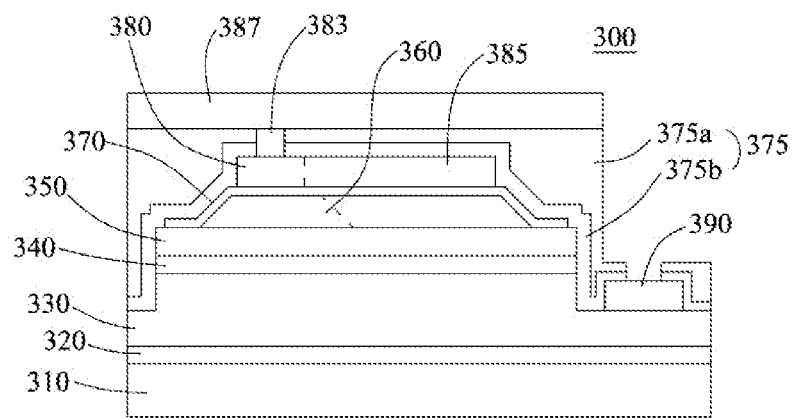
FIG. 18 is a view illustrating yet another example of the semiconductor light emitting device according to the present disclosure.

FIG. 18 is a view illustrating yet another example of the semiconductor light emitting device according to the present disclosure.

The semiconductor light emitting device 300 is substantially identical with the semiconductor light emitting device 200 illustrated in FIG. 17, except that the former further includes a non-conductive reflective film 375. Accordingly, like reference numerals are used to refer to like elements, and their descriptions will not be repeated here.

The semiconductor light emitting device 300 having such a non-conductive reflective film 375 is in the form of a flip chip. The non-conductive reflective film 375 is adapted to cover the first electrode 380, the first finger electrode 385 and the current-spreading conductive film 370, from above the second semiconductor layer 350, such that light from the active layer 340 can be reflected towards the first semiconductor layer 330 on the side of the growth substrate 310. With the non-conductive reflective film 375, a first electrical connection 383 can be provided above the first electrode 380, passing through the non-conductive reflective film 375 and extending upwards. In addition, a first pad electrode 387 is provided on the non-conductive reflective film 375, which is electrically connected with the first electrode 380 via the first electrical connection 383. The non-conductive reflective film 375 can also be formed on some portions of the first semiconductor layer 330 and of the second electrode 390, which are exposed by etching. Any person skilled in the art should understand that it is not absolutely required that all areas above the semiconductor layers 330 and 350 on opposite sides of the substrate 310 should be covered by the non-conductive reflective film 375.

While the non-conductive reflective film 375 serves as a reflective film, preferably it is composed of a light-transmitting material for preventing the absorption of light, and it might also be composed of a light-transmitting dielectric material, such as $SiO_x$, $TiO_x$, $Ta_2O_5$, $MgF_2$, and so on. When the non-conductive reflective film 375 is composed of $SiO_x$, it has a refractive index lower than that of the first semiconductor layer 350 (e.g., p type GaN), such that it can reflect part of light having an incidence angle greater than a critical angle, towards the semiconductor layers 330, 340 and 350. Meanwhile, when the non-conductive reflective film 375 is composed of a DBR (e.g., DBR with a combination of $SiO_2$ and $TiO_2$), it can reflect a larger amount of light towards the semiconductor layers 130, 140 and 150. In FIG. 18, the non-conductive reflective film 375 has a dual structure: a DBR 375a, and a dielectric film 375b having a refractive index lower than that of the first semiconductor layer 350. As the deposition of the DBR 375a which requires high precision is performed after the dielectric film 375b of a certain thickness is formed, the DBR 375a can be produced in a stable manner, and light reflection can be improved, despite the fact that different heterogeneous deposits 350, 370, 380, 385 and 390 are present on the semiconductors 330, 340 and 350. One example of suitable materials for the dielectric film 375b is $SiO_2$, and the film has a thickness suitably between 0.2 μm and 1.0 μm. When the DBR 375a is composed of $TiO_2/SiO_2$, each layer thereof is designed to have an optical thickness ¼ of a given wavelength, and the number of its combinations is suitably in a range of from 4 to 20 pairs.

Considering that the first pad electrode 387 contributes to reflecting light from the active layer 340 towards the substrate 310 or towards the first semiconductor layer 330, the first pad electrode 387 is preferably a conductive reflective film that covers all or most of the non-conductive reflective film 375 from above the second semiconductor layer 350. To this end, metals having a high reflectance, such as Al and Ag can be employed.

Figure 19:
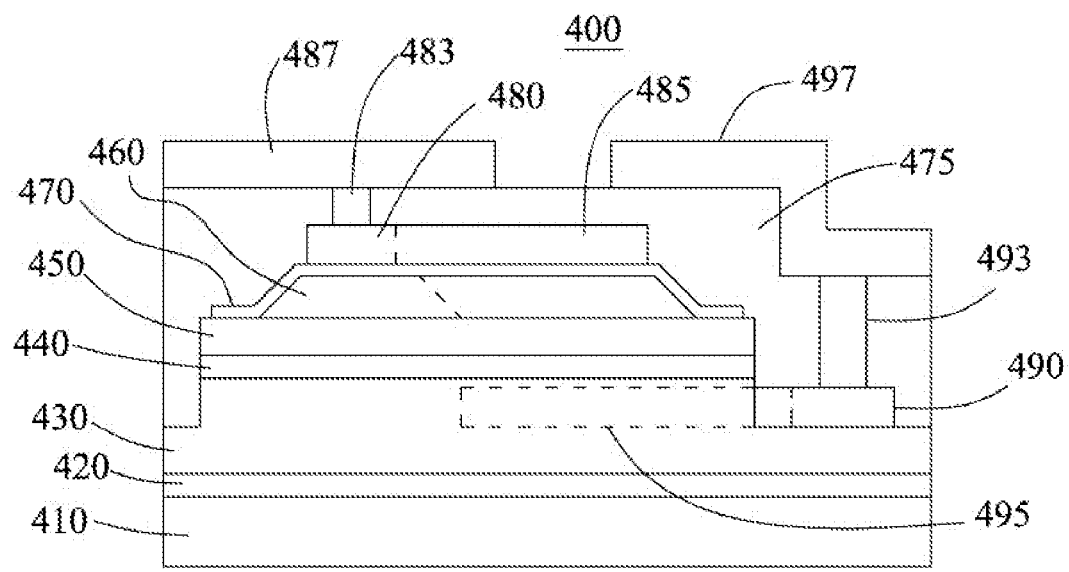
FIG. 19 is a view illustrating yet another example of the semiconductor light emitting device according to the present disclosure.

FIG. 19 is a view illustrating yet another example of the semiconductor light emitting device according to the present disclosure.

The semiconductor light emitting device 400 is substantially identical with the semiconductor light emitting device 300 illustrated in FIG. 18, except that the former further includes a second finger electrode 495 and a second electrical connection 493. Accordingly, like reference numerals are used to refer to like elements, and their descriptions will not be repeated here.

As aforementioned, the semiconductor light emitting device 400 further includes the second finger electrode 495 above the mesa-etched exposed portion of a first semiconductor layer 430, the second finger electrode 495 being extended from a second electrode 290. The second finger electrode 495 promotes a smooth spreading of current, via an excellent electrical contact with the first semiconductor layer 430.

All areas above the semiconductor layers 430 and 450 at the opposite side of the substrate 410 are covered with a non-conductive reflective film 475. That is, the non-conductive reflective film 475 is adapted to cover a first electrode 480, a first finger electrode 485 and a current-spreading conductive film 470 above the second semiconductor layer 450, and to cover both the second electrode 490 and the second finger electrode 495 above the first semiconductor layer 430. With the non-conductive reflective film 475, there are provided a first electrical connection 483 on the first electrode 480, passing through the non-conductive reflective film 475 and extending upwards; and a second electrical connection 493 on the first electrode 490, passing through the non-conductive reflective film 475 and extending upwards. In addition, there are provided, on the non-conductive reflective film 475, a first pad electrode 487 electrically connected with the first electrode 380 via the first electrical connection 483, and a second pad electrode 497 electrically connected with the second electrode 490 via the second electrical connection 493.

Considering that the first pad electrode 487 and the second pad electrode 497 contribute to reflecting light from the active layer 440 towards the substrate 410 or towards the first semiconductor layer 430, the first pad electrode 487 and the second pad electrode 497 are preferably conductive reflective films, while being insulated from each other, which cover all or most of the non-conductive reflective film 475 from above the second semiconductor layer 475. To this end, metals having a high reflectance, such as Al and Ag can be employed.

Hereunder, a variety of embodiments of the present disclosure will be explained.

(1) A semiconductor light emitting further comprising: a first electrode which is formed above the non-conductive reflective film to cover the first electrical connection and the first direct-connection type electrical connection and supplies either electrons or holes to the second semiconductor layer; and a second electrode which is formed above the non-conductive reflective film, away from the first electrode and supplies to the first semiconductor layer, through the contact area, electrons if holes are supplied by the first electrode, or holes if the electrons are supplied by the first electrode.

(2) A semiconductor light emitting device, wherein the first electrical connection is arranged at the lower portion of a region of the first electrode adjacent to the second electrode, and the first direct-connection type electrical connection is arranged at the lower portion of a region of the first electrode that is farther away from the second electrode than the first electrical connection.

(3) A semiconductor light emitting device, wherein the first finger electrode extends towards the second electrode from the first electrical connection.

(4) A semiconductor light emitting device, wherein the contact area has a dot-like contact zone located at the lower portion of the second electrode, and wherein the semiconductor light emitting device further comprises a second direct-connection type electrical connection which passes through the non-conductive reflective film and electrically connects the second electrode with the first semiconductor layer within the dot-like contact zone.

(5) A semiconductor light emitting device, wherein the contact area has a linear contact zone extending from the lower portion of a region of the second electrode adjacent to the first electrode towards the first electrode, and a dot-like contact zone arranged at the lower portion of a region of the second electrode distant from the first electrode, being away from the linear contact zone; and wherein the semiconductor light emitting device further comprises: a second finger electrode extending, between the first semiconductor layer within the linear contact zone and the non-conductive reflective film, in the direction of the first electrode from the lower portion of the second electrode, a second electrical connection which passes through the non-conductive reflective film and electrically connects the second electrode with the second finger electrode, and a second direct-connection type electrical connection which passes through the non-conductive reflective film and electrically connects the second electrode with the first semiconductor layer within the dot-like contact zone.

(6) A semiconductor light emitting device, wherein the first finger electrode has a first extension finger part extending, additionally, from the lower portion of the second electrode, at an angle with the first finger electrode.

(7) A semiconductor light emitting device, wherein the first finger electrode has a first extension finger part extending, additionally, from the lower portion of a region of the second electrode between the second electrical connection and the second direct-connection type electrical connection, at an angle with the first finger electrode.

(8) A semiconductor light emitting device, comprising at least two first finger electrodes, wherein each of the at least two first finger electrodes having a first extension finger part, and the first extension finger parts are interconnected at the lower portion of the second electrode.

(9) A semiconductor light emitting device, wherein the linear contact zone has an additional extension contact zone, extending, additionally, from the lower portion of a region of the first electrode between the first electrical connection and the first direct-connection type electrical connection, at an angle with the linear contact zone, and wherein the second finger electrode has a second extension finger part, extending, additionally, along the additional extension contact zone.

(10) A semiconductor light emitting device, comprising at least two linear contact zones and at least two second finger electrodes, wherein each of the at least two second finger electrodes having a second extension finger part, and the second extension finger parts are interconnected at the lower portion of the first electrode.

(11) A semiconductor light emitting device, wherein the first electrode has a larger width than that of the second electrode, in the extension direction of the first finger electrode.

(12) A semiconductor light emitting device, further comprising: optical absorption barriers provided between the first finger electrode and the first direct-connection type electrical connection and the second semiconductor layer, respectively.

(13) A semiconductor light emitting device, wherein the inclined surface of the current blocking layer has an angle an angle of 45° or below.

(14) A semiconductor light emitting device, wherein the thickness of the current blocking layer is in a range between 3000 Å and 20000 Å.

(15) A semiconductor light emitting device, wherein the thickness of the current-spreading conductive film is in a range between 200 Å and 1000 Å.

(16) A semiconductor light emitting device, wherein the current blocking layer includes at least one selected from the group consisting of $SiO_2$, SiN, SiON, $TiO_2$, $AlO_x$ and $NiO_x$.

(17) A semiconductor light emitting device, wherein the current blocking layer includes a distributed bragg reflector.

(18) A semiconductor light emitting device, wherein a first finger electrode extending from the first electrode on the current-spreading conductive film is further included and wherein the current blocking layer is provided under the first electrode and the first finger electrode between the second semiconductor layer and the current-spreading conductive film.

(19) A semiconductor light emitting device, wherein a non-conductive reflective film formed on the second semiconductor layer to cover the first electrode, the first finger electrode and the current spreading layer for reflecting light from the active layer towards the first semiconductor layer on the side of a growth substrate, and a first electrical connection extended upward to pass through the non-conductive reflective film at the first electrode are further included.

(20) A semiconductor light emitting device, wherein the non-conductive reflective film includes a distributed bragg reflector.

(21) A semiconductor light emitting device, wherein a second electrode provided above the first semiconductor layer exposed by mesa-etching; a second finger electrode extended from the second electrode on the first semiconductor layer exposed by mesa-etching; a non-conductive reflective film formed on the second semiconductor layer to cover the first electrode, the first finger electrode and the current spreading layer and cover the second electrode and the second finger electrode for reflecting light from the active layer towards the first semiconductor layer on the side of a growth substrate; a first electrical connection extended upward to pass through the non-conductive reflective film at the first electrode; and a second electrical connection extended upward to pass through the non-conductive reflective film at the second electrode.

(22) A method of manufacturing the semiconductor light emitting device, wherein the inclined surface of the current blocking layer has an angle an angle of 45° or below.

(23) A method of manufacturing the semiconductor light emitting device, wherein the etching process is a wet etching process.

(24) A method of manufacturing the semiconductor light emitting device, wherein the mask is composed of one of a photoresist and a $SiO_2$.

According to the semiconductor light emitting device in one embodiment of the present disclosure, it is possible to improve the light extraction efficiency.

According to the semiconductor light emitting device in another embodiment of the present disclosure, it is possible to implement a novel type of flip chip.

According to the semiconductor light emitting device in yet another embodiment of the present disclosure, it is possible to implement a reflective film structure incorporated with finger electrodes.

According to the semiconductor light emitting device in yet another embodiment of the present disclosure, it is possible to implement a flip chip incorporated with finger electrodes.

According to the semiconductor light emitting device in yet another embodiment of the present disclosure, it is possible to protect the current-spreading conductive film from any damage.

According to the method for fabricating a semiconductor light emitting device in one embodiment of the present disclosure, it is possible to provide a semiconductor light emitting device having an improved light extraction efficiency.

According to the method for fabricating a semiconductor light emitting device in another embodiment of the present disclosure, it is possible to provide a semiconductor light emitting device capable of protecting the current-spreading conductive film from any damage.

What is claimed:

1. A semiconductor light emitting device, comprising:
   a plurality of semiconductor layers, which grows sequentially using a growth substrate, and which includes a first semiconductor layer having a first conductivity, a second semiconductor layer having a second conductivity different from the first conductivity, and an active layer interposed between the first semiconductor layer and the second semiconductor layer, generating light via electron-hole recombination;
   a contact area where a first semiconductor layer is exposed as a result of the partial removal of a second semiconductor layer and an active layer;
   a non-conductive reflective film adapted to cover the second semiconductor layer and the contact area, such that light from the active layer is reflected towards the first semiconductor layer on the side of a growth substrate;
   a first finger electrode extending between the non-conductive reflective film and the second semiconductor layer;
   a first electrical connection adapted to pass through the non-conductive reflective film and be electrically connected with the first finger electrode; and
   a first direct-connection type electrical connection adapted to pass through the non-conductive reflective film and be electrically connected with the second semiconductor layer.

2. The semiconductor light emitting device as claimed in claim 1, further comprising:
   a first electrode which is formed above the non-conductive reflective film to cover the first electrical connection and the first direct-connection type electrical connection and supplies either electrons or holes to the second semiconductor layer; and
   a second electrode which is formed above the non-conductive reflective film, away from the first electrode and supplies to the first semiconductor layer, through the contact area, electrons if holes are supplied by the first electrode, or holes if the electrons are supplied by the first electrode.

3. The semiconductor light emitting device as claimed in claim 2, wherein the first electrical connection is arranged at the lower portion of a region of the first electrode adjacent to the second electrode, and the first direct-connection type electrical connection is arranged at the lower portion of a region of the first electrode that is farther away from the second electrode than the first electrical connection.

4. The semiconductor light emitting device as claimed in claim 3, wherein the first finger electrode extends towards the second electrode from the first electrical connection.

5. The semiconductor light emitting device as claimed in claim 4,
   wherein the contact area has a dot-like contact zone located at the lower portion of the second electrode, and
   wherein the semiconductor light emitting device further comprises a second direct-connection type electrical connection which passes through the non-conductive reflective film and electrically connects the second electrode with the first semiconductor layer within the dot-like contact zone.

6. The semiconductor light emitting device as claimed in claim 4,
   wherein the contact area has a linear contact zone extending from the lower portion of a region of the second electrode adjacent to the first electrode towards the first electrode, and a dot-like contact zone arranged at the lower portion of a region of the second electrode distant from the first electrode, being away from the linear contact zone; and
   wherein the semiconductor light emitting device further comprises:
   a second finger electrode extending, between the first semiconductor layer within the linear contact zone and the non-conductive reflective film, in the direction of the first electrode from the lower portion of the second electrode,
   a second electrical connection which passes through the non-conductive reflective film and electrically connects the second electrode with the second finger electrode, and
   a second direct-connection type electrical connection which passes through the non-conductive reflective film and electrically connects the second electrode with the first semiconductor layer within the dot-like contact zone.

7. The semiconductor light emitting device as claimed in claim 4, wherein the first finger electrode has a first extension finger part extending, additionally, from the lower portion of the second electrode, at an angle with the first finger electrode.

8. The semiconductor light emitting device as claimed in claim 6, wherein the first finger electrode has a first extension finger part extending, additionally, from the lower portion of a region of the second electrode between the second electrical connection and the second direct-connection type electrical connection, at an angle with the first finger electrode.

9. The semiconductor light emitting device as claimed in claim 8, comprising at least two first finger electrodes, wherein each of the at least two first finger electrodes having a first extension finger part, and the first extension finger parts are interconnected at the lower portion of the second electrode.

10. The semiconductor light emitting device as claimed in claim 6, wherein the linear contact zone has an additional extension contact zone, extending, additionally, from the lower portion of a region of the first electrode between the first electrical connection and the first direct-connection type electrical connection, at an angle with the linear contact zone, and
   wherein the second finger electrode has a second extension finger part, extending, additionally, along the additional extension contact zone.

11. The semiconductor light emitting device as claimed in claim 10, comprising at least two linear contact zones and at least two second finger electrodes, wherein each of the at least two second finger electrodes having a second extension finger part, and the second extension finger parts are interconnected at the lower portion of the first electrode.

12. The semiconductor light emitting device as claimed in claim 4, wherein the first electrode has a larger width than that of the second electrode, in the extension direction of the first finger electrode.

13. The semiconductor light emitting device as claimed in claim 1, further comprising:
optical absorption barriers provided between the first finger electrode and the first direct-connection type electrical connection and the second semiconductor layer, respectively.

14. A semiconductor light emitting device, comprising:
a plurality of semiconductor layers, which grows sequentially using a growth substrate, and which includes a first semiconductor layer having a first conductivity, a second semiconductor layer having a second conductivity different from the first conductivity, and an active layer interposed between the first semiconductor layer and the second semiconductor layer, generating light via electron-hole recombination;
a contact area where a first semiconductor layer is exposed as a result of the partial removal of a second semiconductor layer and an active layer;
a non-conductive reflective film adapted to cover the second semiconductor layer and the contact area, such that light from the active layer is reflected towards the first semiconductor layer on the side of a growth substrate;
a finger electrode extending between the non-conductive reflective film and the plurality of semiconductor layers;
an electrical connection adapted to pass through the non-conductive reflective film and be electrically connected with the finger electrode; and
a direct-connection type electrical connection adapted to pass through the non-conductive reflective film and be electrically connected with the plurality of semiconductor layers.

* * * * *